United States Patent
Masuko

(10) Patent No.: US 9,369,137 B2
(45) Date of Patent: Jun. 14, 2016

(54) CLOCK GENERATION CIRCUIT, SUCCESSIVE COMPARISON A/D CONVERTER, AND INTEGRATED CIRCUIT DEVICE

(71) Applicant: SOCIONEXT INC., Yokohama-shi, Kanagawa (JP)

(72) Inventor: Shuichi Masuko, Funabashi (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/880,927

(22) Filed: Oct. 12, 2015

(65) Prior Publication Data

US 2016/0126962 A1     May 5, 2016

(30) Foreign Application Priority Data

Nov. 4, 2014   (JP) .................................. 2014-224635

(51) Int. Cl.
| | | |
|---|---|---|
| *H03M 1/06* | (2006.01) | |
| *H03L 7/081* | (2006.01) | |
| *H03M 1/46* | (2006.01) | |

(52) U.S. Cl.
CPC ........... *H03L 7/0818* (2013.01); *H03M 1/0624* (2013.01); *H03M 1/46* (2013.01)

(58) Field of Classification Search
CPC ..... H03L 7/0818; H03M 1/0624; H03M 1/46
USPC ................... 341/118, 161, 162, 163
See application file for complete search history.

(56) References Cited

U.S. PATENT DOCUMENTS

| | | | |
|---|---|---|---|
| 8,193,957 B2* | 6/2012 | Yoshioka | H03M 1/462 341/118 |
| 8,692,702 B2* | 4/2014 | Nam | H03M 1/002 341/165 |
| 2010/0013692 A1 | 1/2010 | Yamamoto et al. | |
| 2011/0063147 A1 | 3/2011 | Yoshioka | |
| 2012/0032824 A1 | 2/2012 | Yoshioka | |
| 2013/0009796 A1 | 1/2013 | Sakiyama et al. | |

FOREIGN PATENT DOCUMENTS

| | | |
|---|---|---|
| JP | 08-337121 A | 12/1996 |
| JP | 2011-061597 A | 3/2011 |
| JP | 2011-211371 A | 10/2011 |
| JP | 2012-039475 A | 2/2012 |
| JP | 2012-182638 A | 9/2012 |
| WO | WO 2008/020567 A1 | 2/2008 |

\* cited by examiner

Primary Examiner — Khai M Nguyen
(74) Attorney, Agent, or Firm — Arent Fox LLP

(57) ABSTRACT

A clock generation circuit includes a first loop circuit configured to generate a first clock, and a second loop circuit configured to generate a second clock including a period different from a period of the first clock. A fluctuation in an amount of delay of the first clock is adjusted based on the second clock and the first clock including the period adjusted is output.

19 Claims, 22 Drawing Sheets

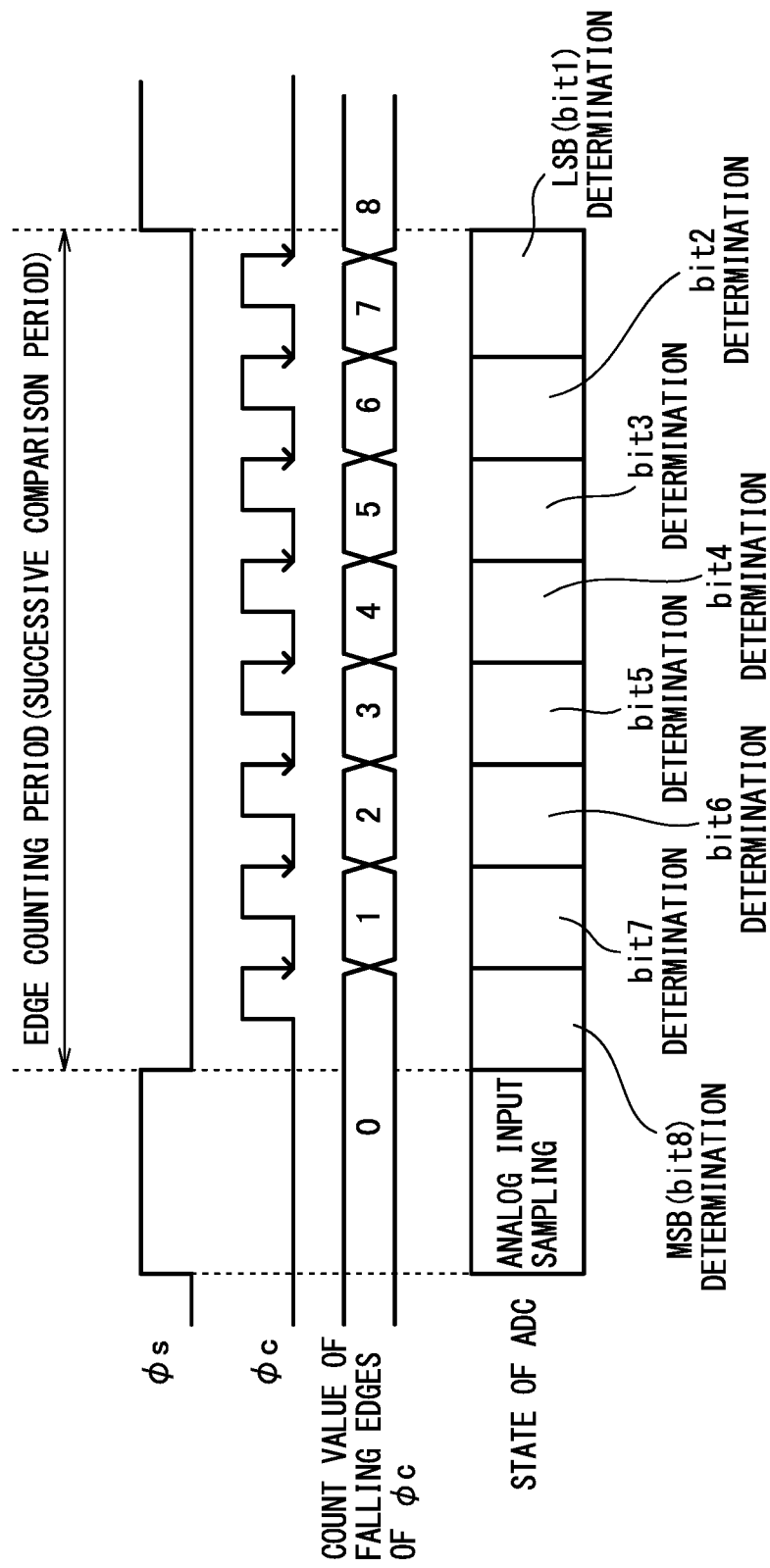

FIG. 11
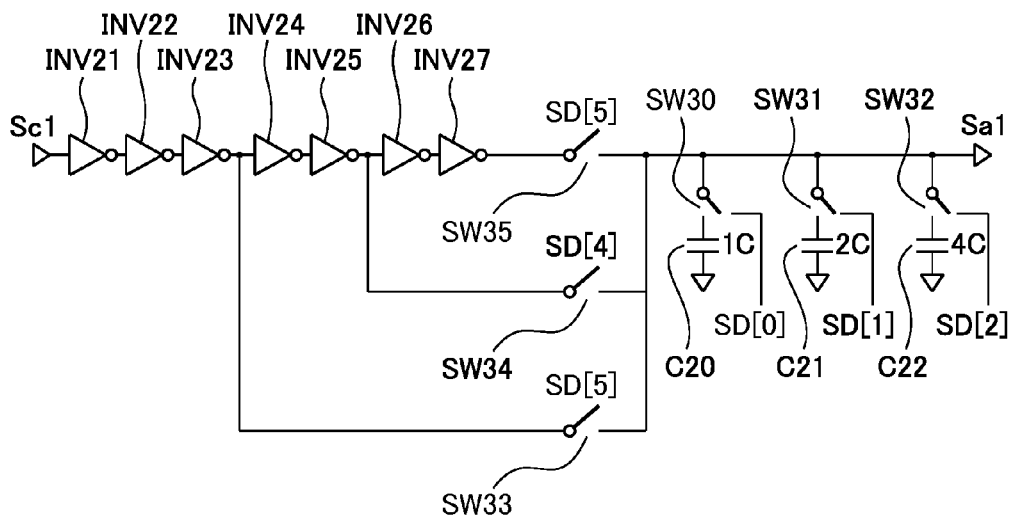
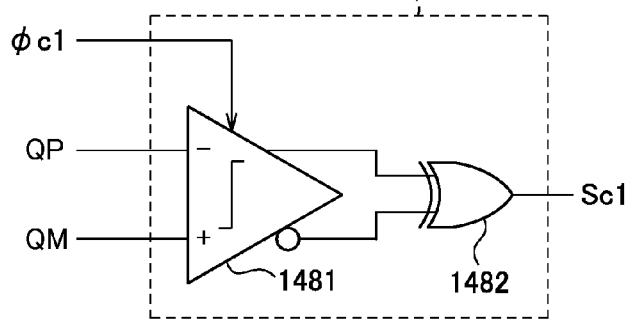
FIG. 12A
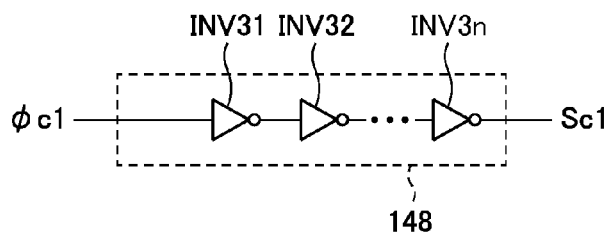
FIG. 12B

FIG. 16

<TRUTH TABLE>

| N-RESOLUTION | N1-RESOLUTION | ADJ |
|---|---|---|
| 1 | 0 | +SD |
| 1 | 1 | +SD |
| 2 | 0 | +SD |
| 2 | 1 | +2×SD |
| 2 | 2 | +2×SD |

N: COUNT VALUE OF $\phi c$
N1: COUNT VALUE OF $\phi c1$
SD: ADJUSTMENT CODE OF FIXED DELAY CIRCUIT

FIG. 20

<TRUTH TABLE>

| N-RESOLUTION | N2-RESOLUTION | ADJ |
|---|---|---|
| 1 | 0 | -SD |
| 1 | 1 | -SD |
| 2 | 0 | -SD |
| 2 | 1 | -2×SD |
| 2 | 2 | -2×SD |

N: COUNT VALUE OF $\phi c$
N2: COUNT VALUE OF $\phi c2$
SD: ADJUSTMENT CODE OF FIXED DELAY CIRCUIT

FIG. 23A

<TRUTH TABLE>

| N-RESOLUTION | N1-RESOLUTION | ADJ |
|---|---|---|
| 1 | 0 | +SD |
| 1 | 1 | +SD |
| 2 | 0 | +SD |
| 2 | 1 | +2×SD |
| 2 | 2 | +2×SD |

N: COUNT VALUE OF $\phi c$
N1: COUNT VALUE OF $\phi c2$
SD: ADJUSTMENT CODE OF FIXED DELAY CIRCUIT

FIG. 23B

<TRUTH TABLE>

| N-RESOLUTION | N2-RESOLUTION | ADJ |
|---|---|---|
| 1 | 0 | −SD |
| 1 | 1 | −SD |
| 2 | 0 | −SD |
| 2 | 1 | −2×SD |
| 2 | 2 | −2×SD |

N: COUNT VALUE OF $\phi c$
N2: COUNT VALUE OF $\phi c2$
SD: ADJUSTMENT CODE OF FIXED DELAY CIRCUIT

CLOCK GENERATION CIRCUIT, SUCCESSIVE COMPARISON A/D CONVERTER, AND INTEGRATED CIRCUIT DEVICE

CROSS-REFERENCE TO RELATED APPLICATION

This application is based upon and claims the benefit of priority of the prior Japanese Patent Application No. 2014-224635, filed on Nov. 4, 2014, the entire contents of which are incorporated herein by reference.

FIELD

The embodiments discussed herein are related to a clock generation circuit, a successive comparison A/D converter, and an integrated circuit device.

BACKGROUND

In recent years, a successive comparison A/D (Analog-to-Digital) converter is implemented in a relatively simple circuitry, is highly compatible with the CMOS process, and achieves a relatively short conversion time, thus being widely used for various purposes. The successive comparison A/D converter generally includes a DAC (Digital-to-Analog Converter), a comparator, and a DAC control circuit.

As the operation of the overall successive comparison A/D converter, first, in the sampling period, input voltages are sampled and held as sample voltages. In the next comparison period, the voltages to be compared are successively compared with the sample voltages.

In other words, in one comparison operation by the comparator, one voltage to be compared corresponding to one digital code is compared with the sample voltage to determine the value of the voltage to be compared relative to the sample voltage.

The DAC control circuit changes the digital code in accordance with the comparison result output from the comparator to, in turn, change the voltage value to be compared from a large-step voltage to a small-step voltage, and N comparison operations are successively executed to obtain N-bit digital data by conversion.

When, for example, the edge count becomes different from an expected value (a count equal to the resolution) due to PVT (Process/Voltage/Temperature) fluctuations, the successive comparison A/D converter, as described above, changes the delay amount adjustment code in steps of one code to adjust the amount of delay and, in turn, adjust the loop operating frequency.

In other words, in the comparison period, N comparison operations are successively executed by the comparator, based on the edges of a predetermined pulse signal (asynchronous clock: φc), to convert an input signal into N-bit digital data.

Therefore, when the edge count value is smaller than the resolution, a predetermined number of A/D conversions can hardly be performed, thus lowering the A/D conversion accuracy. On the other hand, when the edge count value is larger than the resolution, the operating speed may be so high as to degrade the A/D conversion accuracy.

As described above, when PVT fluctuations occur (e.g., the voltage, the temperature, or other factors rapidly change), it takes a long time for the successive comparison A/D converter to adjust the amount of delay. This means that it takes much time for the edge count value (the number of determination operations) and the resolution to become equal to each other.

It may be possible to change the voltage or the temperature to allow setting of an appropriate amount of delay corresponding to each condition in advance. In this case, the adjustment period can be shortened but the examination cost, the circuit area, and the power consumption rise.

By the way, in the past, various driving clock adjusting techniques of the successive comparison A/D converter have been proposed.

Patent Document 1: Japanese Laid-open Patent Publication No. 2011-061597

Patent Document 2: Japanese Laid-open Patent Publication No. 2012-039475

Patent Document 3: Japanese Laid-open Patent Publication No. 2012-182638

Patent Document 4: Japanese Laid-open Patent Publication No. H07 (1995)-170185

SUMMARY

According to an aspect of the embodiments, there is provided a clock generation circuit includes a first loop circuit configured to generate a first clock, and a second loop circuit configured to generate a second clock including a period different from a period of the first clock.

A fluctuation in an amount of delay of the first clock is adjusted based on the second clock and the first clock including the period adjusted is output.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a timing chart for explaining how the successive comparison A/D converter operates appropriately;

FIG. 11 is a circuit diagram illustrating an exemplary fixed delay circuit in the asynchronous clock generation circuit depicted in FIG. 7;

FIGS. 12A and 12B are diagrams illustrating exemplary self-excited circuits each provided in the asynchronous clock generation circuit depicted in FIG. 7;

FIG. 16 illustrates an exemplary truth table in the process of calculating a delay amount adjustment code depicted in FIG. 15;

FIG. 20 illustrates an exemplary truth table in the process of calculating a delay amount adjustment code depicted in FIG. 19;

FIG. 23A and FIG. 23B are diagrams illustrating exemplary truth tables in the process of calculating a delay amount adjustment code depicted in FIG. 22;

DESCRIPTION OF EMBODIMENTS

First, before describing embodiments of a clock generation circuit, a successive comparison A/D converter and an integrated circuit, an exemplary asynchronous clock generation circuit (clock generation circuit), an exemplary successive comparison A/D converter, an exemplary method for adjusting the operation clock of the successive comparison A/D converter, and their problems will be described first with reference to FIG. 1 to FIG. 6B.

Figure 1:
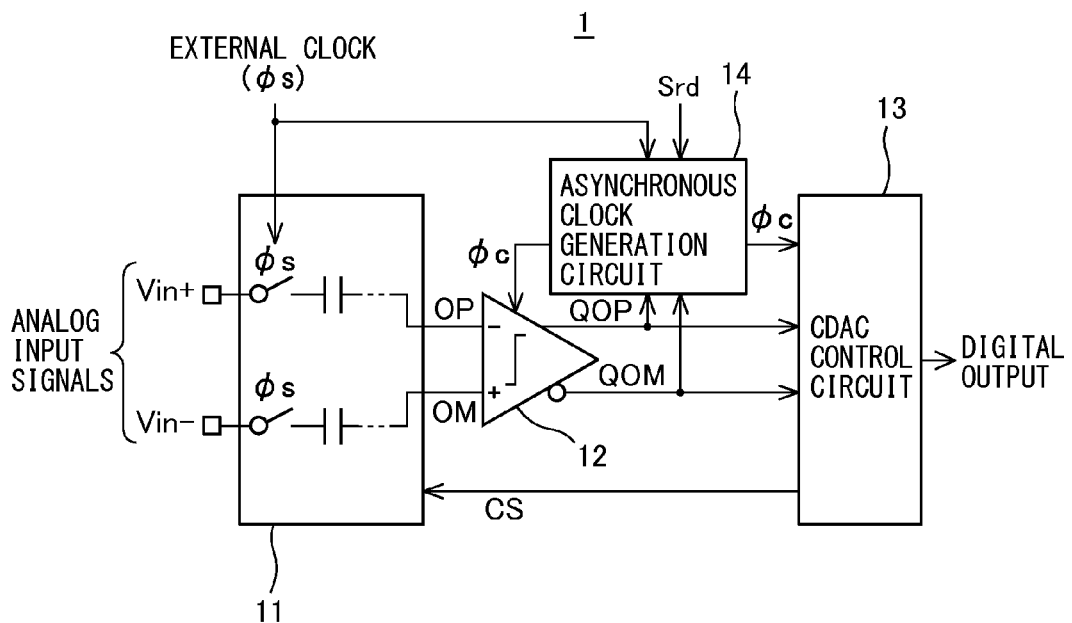
FIG. 1 is a block diagram illustrating an exemplary successive comparison A/D converter.

FIG. 1 is a block diagram illustrating an exemplary successive comparison A/D converter. Referring to FIG. 1, reference numeral 11 denotes a charge redistribution D/A converter (capacitor DAC: CDAC); 12, a comparator; 13, a CDAC control circuit; and 14, an asynchronous clock generation circuit.

The successive comparison A/D converter 1 includes the CDAC 11, the comparator 12, the CDAC control circuit 13, and the asynchronous clock generation circuit 14, as depicted in FIG. 1. The CDAC 11 generates an analog voltage based on a switch control signal (digital code) CS from the CDAC control circuit 13.

The CDAC 11 includes, for example, a plurality of capacitance elements (capacitors) including a capacitance ratio of 1:1:2:4:8: . . . and a plurality of switches (switch circuit). The plurality of switches are controlled in switching in accordance with the digital code CS from the CDAC control circuit 13.

Various configurations are applicable to the CDAC 11, and the CDAC 11 may even be replaced with, for example, a resistor DAC or a DAC circuit including a combination of a capacitor main-DAC and a resistor sub-DAC, instead of using a capacitor DAC (CDAC). Further, the CDAC 11 and the comparator 12 may process single-ended signals in place of complementary signals.

First, in the sampling period, the CDAC 11 samples complementary analog input signals (input voltages) Vin+ and Vin− and holds them as sample voltages. In the next comparison period, the comparator 12 successively compares the voltages to be compared with the sample voltages.

The voltages to be successively compared with the sample voltages are defined for a reference voltage, based on the digital code CS, and include step widths of, for example, ½Vref, ¼Vref, ⅛Vref, . . . .

The comparator 12 successively compares the values of the voltages to be compared with the sample voltages, N times to obtain an N-bit digital code (digital output) corresponding to the values of the sample voltages.

In other words, the comparator 12 executes a comparison operation using, as inputs, analog voltages OP and OM serving as the outputs of the CDAC 11. The CDAC control circuit 13 successively changes the digital code CS, based on outputs QOP and QOM representing the comparison results obtained by the comparator 12, to generate a digital code for an input signal sampled in a given cycle of an external clock φs.

The CDAC 11, for example, stores the analog input voltages Vin+ and Vin− in the capacitance elements within the CDAC 11 during a period (sampling period) in which the external clock φs includes high level "H." More specifically, for example, an input voltage Vin+ is applied in parallel to each of a plurality of positive capacitance elements to charge these capacitance elements to a voltage value equal to the input voltage Vin+.

After the completion of sampling, the connection of the plurality of positive capacitance elements is switched by the switch circuit (the plurality of switches) to selectively connect one end of each capacitance element to, for example, either a positive reference voltage Vref+ or GND (signal ground), and the other end of this capacitance element to a positive common terminal. With this operation, charges are redistributed so that a potential corresponding to the input voltage Vin+ and the voltage across Vref+ and GND divided by the capacitance appears at the positive common terminal.

Similarly, for example, an input voltage Vin− is applied in parallel to each of a plurality of negative capacitance elements to charge these capacitance elements to a voltage value equal to the input voltage Vin−. After the completion of sampling, the connection of the plurality of negative capacitance elements is switched by the switch circuit to selectively connect one end of each capacitance element to, for example, either a negative reference voltage Vref− or GND (signal ground), and the other end of this capacitance element to a negative common terminal. With this operation, charges are redistributed so that a potential corresponding to the input voltage Vin− and the voltage across Vref− and GND divided by the capacitance appears at the negative common terminal.

The potentials OP and OM appearing at two terminals: the positive and negative common terminals are applied to two inputs (complementary inputs) of the comparator 12. The connection of the switch circuit is controlled by the digital code CS from the CDAC control circuit 13 to generate a desired voltage to be compared. The two input terminals of the comparator 12 may be short-circuited in the sampling period.

A pulse signal (asynchronous clock) φc generated by the asynchronous clock generation circuit 14 is input to the reset terminal of the comparator 12. The asynchronous clock φc is also supplied to the CDAC control circuit 13 and functions as a clock which synchronizes the successive comparison operations of respective units of the successive comparison A/D converter 1.

Note, however, that the asynchronous clock φc is asynchronous to the external clock φs, and in this respect, the circuit 14 that generates an asynchronous clock φc is defined as an asynchronous clock generation circuit. The comparator 12, for example, executes a comparison operation during a period (sampling period) in which the asynchronous clock φc includes high level "H," and is reset during a period in which the asynchronous clock φc includes low level "L" (a comparison operation is stopped).

Hence, the two outputs (complementary outputs) QOP and QOM of the comparator 12 include different potentials corresponding to the comparison result during the period in which the asynchronous clock φc is "H" and the same potential during the period in which the asynchronous clock φc is "L."

The CDAC control circuit 13 successively changes the digital code in synchronism with the asynchronous clock φc (to be precise, signal transition of the asynchronous clock φc), based on the outputs QOP and QOM of the comparator 12. With this operation, comparison operations are successively executed by the comparator 12 while sequentially changing the connection state of the switches in the CDAC 11.

As described above, by changing the digital code while performing successive comparison operations, the difference between the two output voltages of the CDAC 11 is decreased at step widths corresponding to ½, ¼, ⅛, . . . of a reference voltage. As a result, the CDAC control circuit 13 retrieves a digital code (switch state) corresponding to the difference between the analog input potentials Vin+ and Vin−.

Figure 2:
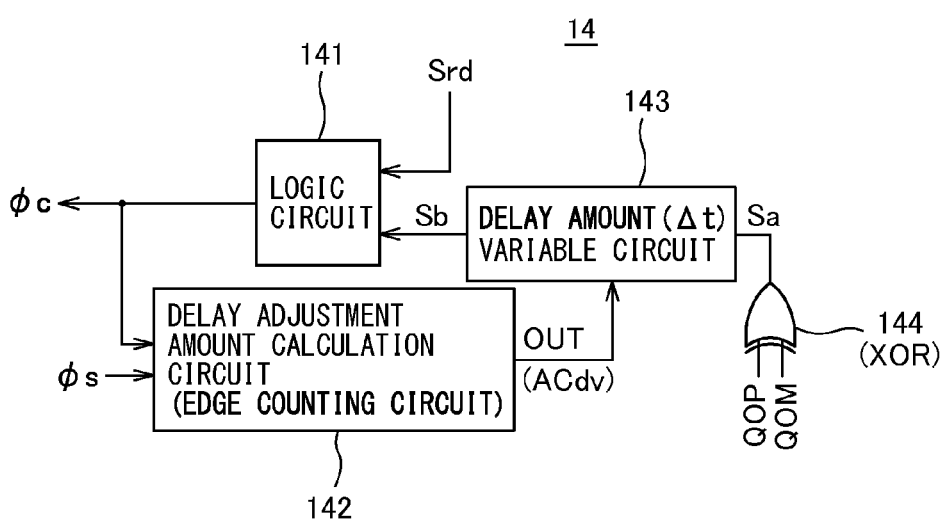
FIG. 2 is a block diagram illustrating an exemplary asynchronous clock generation circuit in the successive comparison A/D converter depicted in FIG. 1.

FIG. 2 is a block diagram illustrating an example of the asynchronous clock generation circuit 14 in the successive comparison A/D converter depicted in FIG. 1. The asynchronous clock generation circuit 14 includes a logic circuit 141, a delay adjustment amount calculation circuit (edge counting circuit) 142, an exclusive OR (XOR) circuit 144, and a delay amount (Δt) variable circuit 143, as represented in FIG. 2.

Upon receiving the comparison result outputs (complementary outputs) QOP and QOM from the comparator 12, the XOR circuit 144 outputs a first signal value (for example, "H") in accordance with assertion of the comparison result output and a second signal value (for example, "L") in accordance with negation of the comparison result output. In other words, the XOR circuit 144 outputs "H" when QOP and QOM include different potentials and "L" when QOP and QOM include the same potential.

The delay amount variable circuit 143 resets the comparator 12 by signal transition generated by delaying a change in signal state of the output of the comparator 12. In other words, in the example depicted in FIG. 2, the delay amount variable circuit 143 generates a pulse signal Sb by delaying and inverting a signal (the output of the XOR circuit 144) Sa corresponding to the output of the comparator 12.

In response to, for example, a change of a ready signal Srd from "L" to "H," the logic circuit 141 changes the asynchronous clock φc to "H." Subsequently, when the ready signal Srd remains "H," the logic circuit 141 directly passes the pulse signal Sb output from the delay amount variable circuit 143 and outputs it as the asynchronous clock φc.

In this example, the comparator 12 is reset by a falling edge of the asynchronous clock φc. In other words, when the asynchronous clock φc changes to "L," the output of the comparator 12 is negated (QOP and QOM include the same potential).

As described above, signal transition of the asynchronous clock φc is generated by the delay amount variable circuit 143 by delaying a change in signal state of the output of the comparator 12 (the output edge of the XOR circuit 144). The comparator 12 is reset by the falling signal transition of the asynchronous clock φc.

The delay adjustment amount calculation circuit 142 counts the number of falling signal transitions (falling edges) of the asynchronous clock φc generated in one cycle of the external clock φc and adjusts the amount of delay of the delay amount variable circuit 143 in accordance with the count value of signal transitions.

For example, when the edge count value is larger than a predetermined count, the delay adjustment amount calculation circuit 142 determines that the amount of delay is decreased, and increases the amount of delay of the delay amount variable circuit 143. When the edge count value is smaller than the predetermined count, the delay adjustment amount calculation circuit 142 determines that the amount of delay is increased, and decreases the amount of delay of the delay amount variable circuit 143. In this manner, the asynchronous clock generation circuit 14 counts the number of edges of the operation clock (pulse signal) φc of the comparator 12 in synchronism with the external clock φs to adjust the amount of delay Δt.

Figure 3:
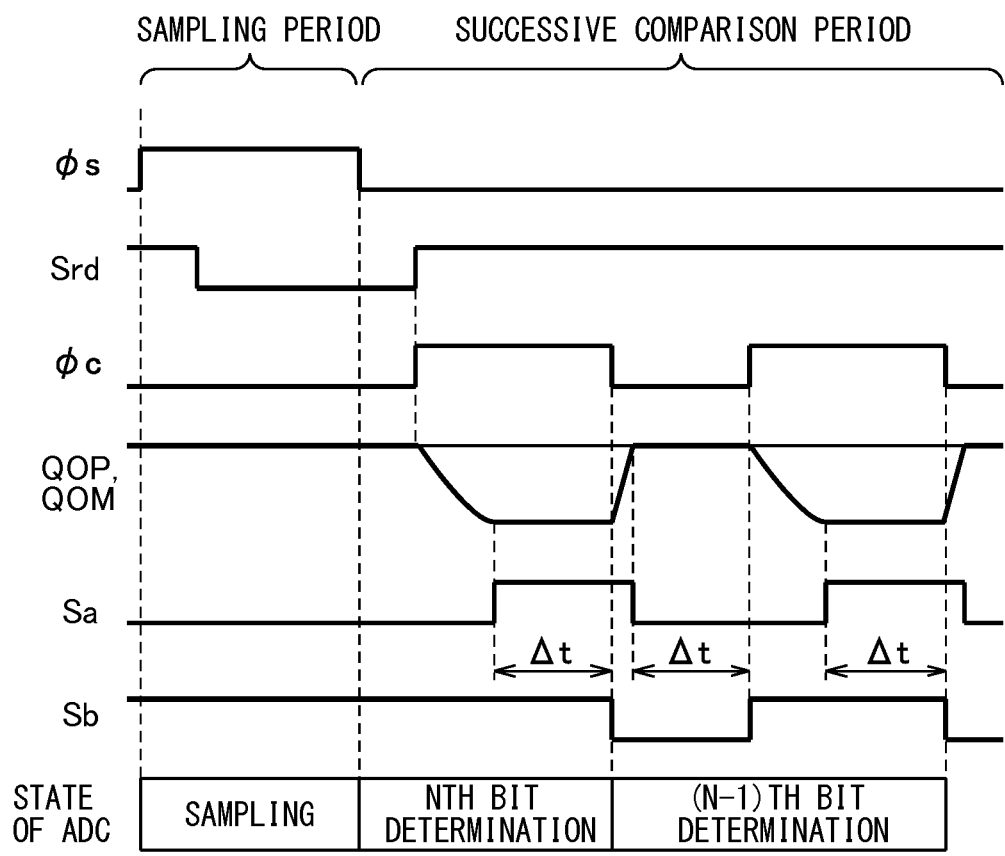
FIG. 3 is a timing chart illustrating an exemplary operation of the successive comparison A/D converter.
Figure 4:
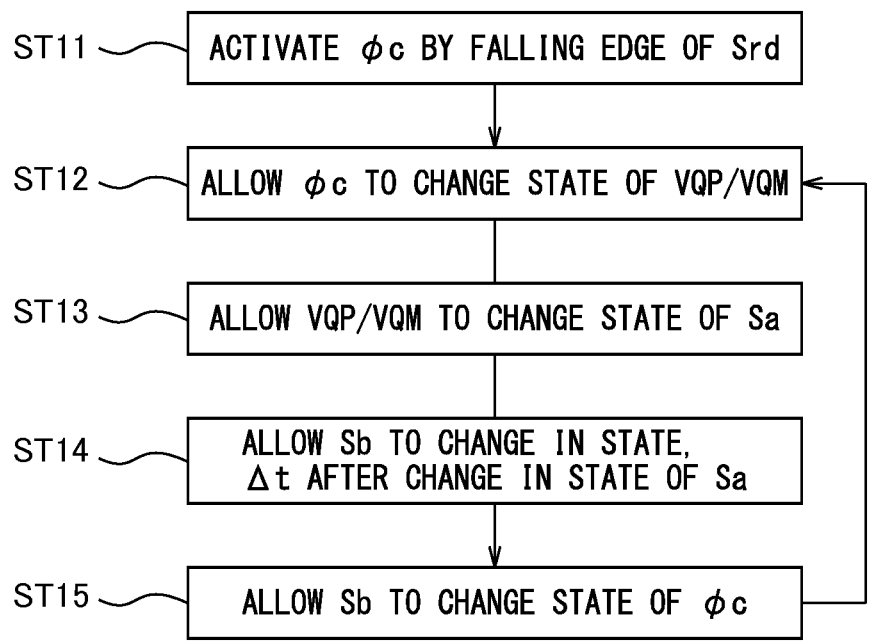
FIG. 4 is a flowchart for explaining the exemplary operation of the successive comparison A/D converter.

FIG. 3 is a timing chart illustrating an exemplary operation of the successive comparison A/D converter, and FIG. 4 is a flowchart for explaining the exemplary operation of the successive comparison A/D converter. As depicted in FIG. 3, a period in which the external clock φs is "H" corresponds to the sampling period, in which the successive comparison A/D converter 1 is in a sampling state. Then, when the external clock φs changes to "L," a successive comparison period comes.

In the successive comparison period, first, the ready signal Srd changes to "H" and the asynchronous clock φc rises to "H" (step ST11). In other words, during a period in which the ready signal Srd is "H," the pulse signal Sb output from the delay amount variable circuit 143 depicted in FIG. 3 is preferably used directly as the asynchronous clock φc.

The pulse signal Sb output from the delay amount variable circuit 143 is "H" in the initial state, and the asynchronous clock φc is "H" accordingly, as depicted in FIG. 3. In this way, setting the asynchronous clock φc "H" first allows the comparator 12 to execute a comparison operation first in the successive comparison period.

When the comparator 12 executes a comparison operation during a period in which the asynchronous clock φc is "H," the output voltages QOP and QOM of the comparator 12 include different potentials in accordance with the comparison result (step ST12), as depicted in FIG. 3. Based on this arrangement, the signal Sa output from the XOR circuit 144 changes from "L" to "H" (step ST13).

A pulse signal Sb output from the delay amount variable circuit 143 is generated by delaying the signal Sa output from the XOR circuit 144 by the amount of delay Δt and inverting it by the delay amount variable circuit 143. In other words, the pulse signal Sb changes from "H" to "L," Δt after a change in state of the signal Sa from "L" to "H" (step ST14).

In the example depicted in FIG. 3, as described earlier, during a period in which the ready signal Srd is "H," the pulse signal Sb output from the delay amount variable circuit 143 is directly used as the asynchronous clock φc. Therefore, a change in state of the pulse signal Sb from "H" to "L" appears as a change in state of the asynchronous clock φc from "H" to "L" (step ST15).

When the comparator 12 stops its comparison operation during a period in which the asynchronous clock φc is "L," the output voltages QOP and QOM of the comparator 12 include the same potential (step ST12). Based on this arrangement, the signal Sa output from the XOR circuit 144 changes from "H" to "L" (step ST13).

The pulse signal Sb changes from "L" to "H," At after a change in state of the signal Sa from "H" to "L" (step ST14). A change in state of the pulse signal Sb from "L" to "H" appears as a change in state of the asynchronous clock φc from "L" to "H" (step ST15). Subsequently, successive comparison processes are sequentially executed by repeating the processes in steps ST12 to ST15.

FIG. 5 is a timing chart for explaining how the successive comparison A/D converter operates appropriately and, more particularly, for explaining an appropriate operation when a successive comparison A/D converter 1 includes a resolution of 8 bits.

As described earlier, the delay adjustment amount calculation circuit 142 counts the number of falling edges of the asynchronous clock φc occurring in one cycle of the external clock φs and adjusts the amount of delay of the delay amount variable circuit 143 in accordance with the count value of edges.

The amount of delay of the delay amount variable circuit 143 is adjusted so that, for example, the count value of edges reaches a predetermined value. When the successive comparison A/D converter 1 includes a resolution of 8 bits, it is desired to execute eight successive comparison operations in one cycle of the external clock φs (to be more precise, a successive comparison period obtained by subtracting the sample period from one cycle). In other words, in the successive comparison period, it is desired to perform a series of operations continuing until a reset state is obtained after the completion of the eighth comparison operation of the comparator 12.

In the example depicted in FIG. 5, in the edge counting period (=successive comparison period), eight falling edges of the asynchronous clock φc for resetting the comparator 12 are occurred. In this manner, controlling the edge count value to be 8 makes it possible to determine all of eight bit values of MSB (bit8) to LSB (bit1) by comparison operations.

Figure 6A:
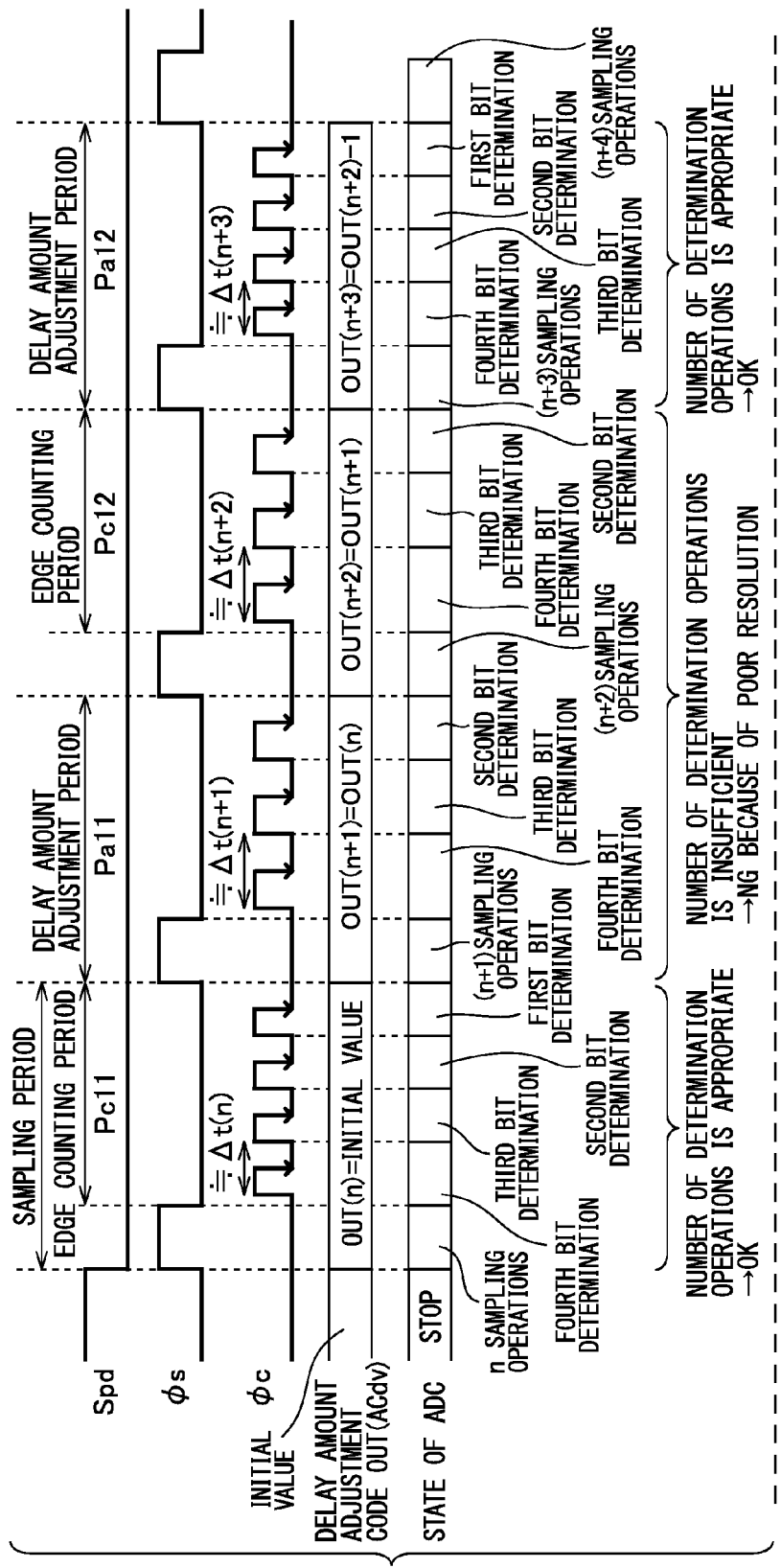
FIG. 6A and FIG. 6B illustrate timing charts for explaining a clock adjusting operation in the successive comparison A/D converter.
Figure 6B:
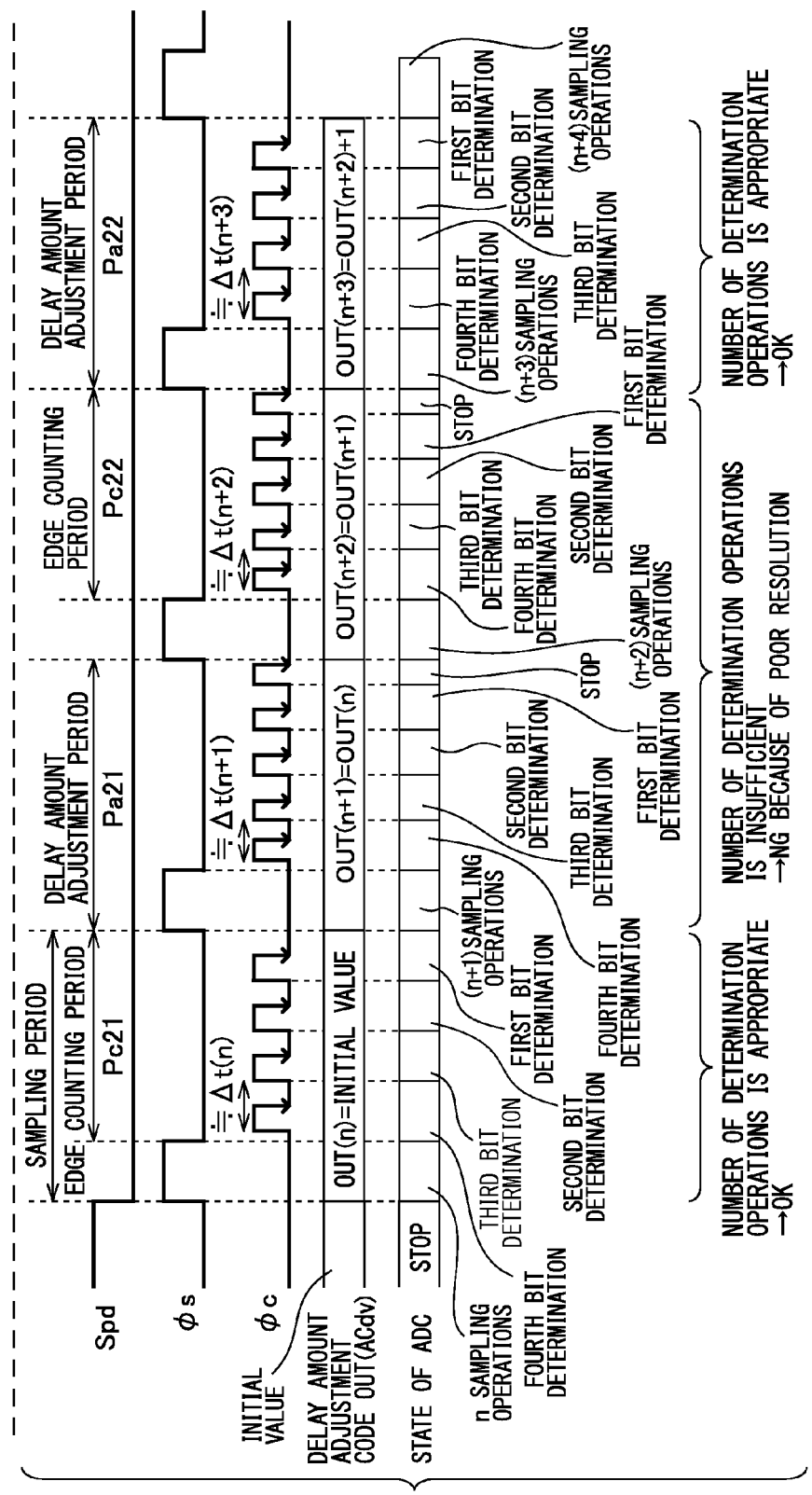

FIG. 6A and FIG. 6B illustrate timing charts for explaining a clock adjusting operation in the successive comparison A/D converter and, more particularly, for explaining a clock adjusting operation when the successive comparison A/D converter 1 includes a resolution of 4 bits.

FIG. 6A is a timing chart for explaining a clock adjusting operation (an operation for adjusting the amount of delay Δt) when the number of determination operations (the number of comparison operations) is insufficient, and FIG. 6B is a timing chart for explaining a clock adjusting operation when the number of determination operations is excessive.

As described earlier, the asynchronous clock generation circuit 14 counts the number of edges (falling edges) of the pulse signal (the operation clock of the comparator 12) φc in synchronism with the external clock φs to adjust the amount of delay Δt. In other words, when, for example, the edge count becomes different from an expected value (a count equal to the resolution) due to a rapid change in voltage or temperature, the asynchronous clock generation circuit 14 changes a delay amount adjustment code OUT(ACdv) in steps of one code to adjust the amount of delay Δt and, in turn, adjust the loop operating frequency (i.e., the frequency of the operation clock φc of the comparator 12).

The edge count and the amount of delay are adjusted not simultaneously but alternately. The asynchronous clock φc is also supplied to the CDAC control circuit 13 and used as a clock which synchronizes the successive comparison operations of respective units of the successive comparison A/D converter 1. Referring to FIG. 6A and FIG. 6B, reference numeral Spd denotes a power-down signal. The successive comparison A/D converter 1 (ADC) assumes a power-down state and stops when Spd is "H," while it assumes an ON state when Spd is "L".

First, FIG. 6A illustrates an exemplary case where the appropriate number of determination operations (the number of comparison operations) in an edge counting period Pc11 is "4" (four falling edges equal to a resolution of 4 bits) while the number of determination operations is changed to "3" in a delay amount adjustment period Pa11.

In other words, in a sampling period including the edge counting period Pc11, the delay amount adjustment code OUT(ACdv) is OUT(n)=Initial Value and the ADC performs four determination operations (corresponding to 4 bits of the resolution). Thus, OUT(n+1)=OUT(n)=Initial Value holds in the next delay amount adjustment period Pa11 as well.

In the delay amount adjustment period Pa11, when the falling edge of the asynchronous clock φc changes from "4" to "3" due to a rapid change in, for example, voltage or temperature, the ADC can perform only three determination operations so that the resolution lowers from 4 bits to 3 bits, resulting in inappropriateness (NG).

In the next edge counting period Pc12, since the amount of delay can hardly be adjusted, the delay amount adjustment code OUT remains OUT(n+2)=OUT(n+1) so that the ADC can perform only three determination operations, resulting in NG.

As described above, when the amount of delay Δt(n+1) in the delay amount adjustment period Pa11 exceeds the amount of delay Δt(n) in the edge counting period Pc11 due to a rapid change in, for example, voltage or temperature, it becomes difficult to perform four determination operations (comparison operations) in each of the delay amount adjustment period Pa11 and the edge counting period Pc12. In other words, in each of the delay amount adjustment period Pa11 and the edge counting period Pc12, the number of determination operations becomes "3," which means the lack of "1," so that the resolution lowers from 4 bits to 3 bits, resulting in NG.

In the next delay amount adjustment period Pa12, the amount of delay is adjusted in accordance with the value counted in the immediately preceding, edge counting period Pc12. In other words, in the delay amount adjustment period Pa12, the delay amount adjustment code OUT is set to OUT(n+3)=OUT(n+2)−1 to decrease the amount of delay by one code.

A process for adjusting the amount of delay can always be performed, for example, in parallel with an A/D conversion process by the successive comparison A/D converter 1. The same applies to a process for adjusting the amount of delay to be described next with reference to FIG. 6B, and a process for adjusting the amount of delay in each embodiment to be described with reference to FIG. 7 and subsequent figures, both of which can always be performed in parallel with A/D conversion processes.

Referring to FIG. 6A, in the delay amount adjustment period Pa12, the number of determination operations increases by "1" and returns from "3" to "4." However, the number of determination operations is normally returned to "4" by repeating a plurality of processes for decreasing the amount of delay in the delay amount adjustment period Pa12 by one code.

Thus, when the number of determination operations becomes insufficient upon an increase in amount of delay $\Delta t$ of the asynchronous clock $\phi c$ due to a rapid change in, for example, voltage or temperature, it takes a considerable time for the ADC (successive comparison A/D converter 1) to return the number of determination operations to an original value and perform an A/D conversion process.

FIG. 6B illustrates an exemplary case where the appropriate number of determination operations in an edge counting period Pc21 is "4" while the number of determination operations is changed to "5" in a delay amount adjustment period Pa21. In other words, in a sampling period including the edge counting period Pc21, the delay amount adjustment code OUT is OUT(n)=Initial Value and the ADC performs four determination operations (corresponding to 4 bits of the resolution). Thus, OUT(n+1)=OUT(n)=Initial Value holds in the next delay amount adjustment period Pa21 as well.

In the delay amount adjustment period Pa21, when the falling edge of the asynchronous clock $\phi c$ changes from "4" to "5" due to a rapid change in, for example, voltage or temperature, the ADC undergoes time setting to perform five determination operations and this makes it hard to perform four determination operations with time to spare. In other words, the conversion speed of the ADS is so high as to result in NG (inappropriateness). When the resolution of the ADC is 4 bits, the fifth determination operation is canceled (stopped).

In the next edge counting period Pc22, since the amount of delay can hardly be adjusted, the delay amount adjustment code OUT remains OUT(n+2)=OUT(n+1) so that the ADC operates at so high a conversion speed as to perform five determination operations, resulting in NG.

As described above, when the amount of delay $\Delta t(n+1)$ in the delay amount adjustment period Pa21 falls below the amount of delay $\Delta t(n)$ in the edge counting period Pc21 due to a rapid change in, for example, voltage or temperature, it becomes difficult to perform four determination operations with time to spare in each of the delay amount adjustment period Pa21 and the edge counting period Pc22.

In the next delay amount adjustment period Pa22, the amount of delay is adjusted in accordance with the value counted in the immediately preceding, edge counting period Pc22. In other words, in the delay amount adjustment period Pa22, the delay amount adjustment code OUT is set to OUT(n+3)=OUT(n+2)+1 to increase the amount of delay by one code.

Referring to FIG. 6B, in the delay amount adjustment period Pa22, the number of determination operations decreases by "1" and returns from "5" to "4." However, the number of determination operations is normally returned to "4" by repeating a plurality of processes for increasing the amount of delay in the delay amount adjustment period Pa22 by one code.

Thus, when the number of determination operations becomes excessive upon a decrease in amount of delay $\Delta t$ of the asynchronous clock $\phi c$ due to a rapid change in, for example, voltage or temperature, it takes a considerable time for the successive comparison A/D converter 1 to return the number of determination operations to an original value and perform an A/D conversion process.

As described above, when the edge count becomes different from an expected value (a count equal to the resolution) due to a rapid change in, for example, voltage or temperature, the successive comparison A/D converter 1 changes the delay amount adjustment code ACdv in steps of one code to adjust the amount of delay $\Delta t$ and control the loop operating frequency.

Hence, when the edge count value is smaller than the resolution, it becomes difficult to perform a predetermined number of A/D conversions so that the resolution of A/D conversion by the successive comparison A/D converter is disadvantageously kept low for a considerable time.

On the other hand, when the edge count value is larger than the resolution, the operating speed of the CDAC (11) or comparator (12) may be so high as to disadvantageously keep the A/D conversion accuracy low for a considerable time. These factors may lower the yield in examinations, increase the examination time, and cause a failure in the system.

As described above, in the successive comparison A/D converter described with reference to, for example, FIG. 1 to FIG. 6B, the adjustment period of the amount of delay $\Delta t$ prolongs upon a rapid change in, for example, voltage or temperature, so that it take a considerable time for the edge count value and the resolution to become equal to each other.

It may be possible to obtain an appropriate delay amount adjustment code ACdv corresponding to each condition by changing the voltage or the temperature in advance. In this case, the adjustment period can be shortened but the examination cost, the circuit area, and the power consumption rise. This cancels out the advantages of the successive comparison A/D converter in terms of its small area and low power consumption.

Figure 7:
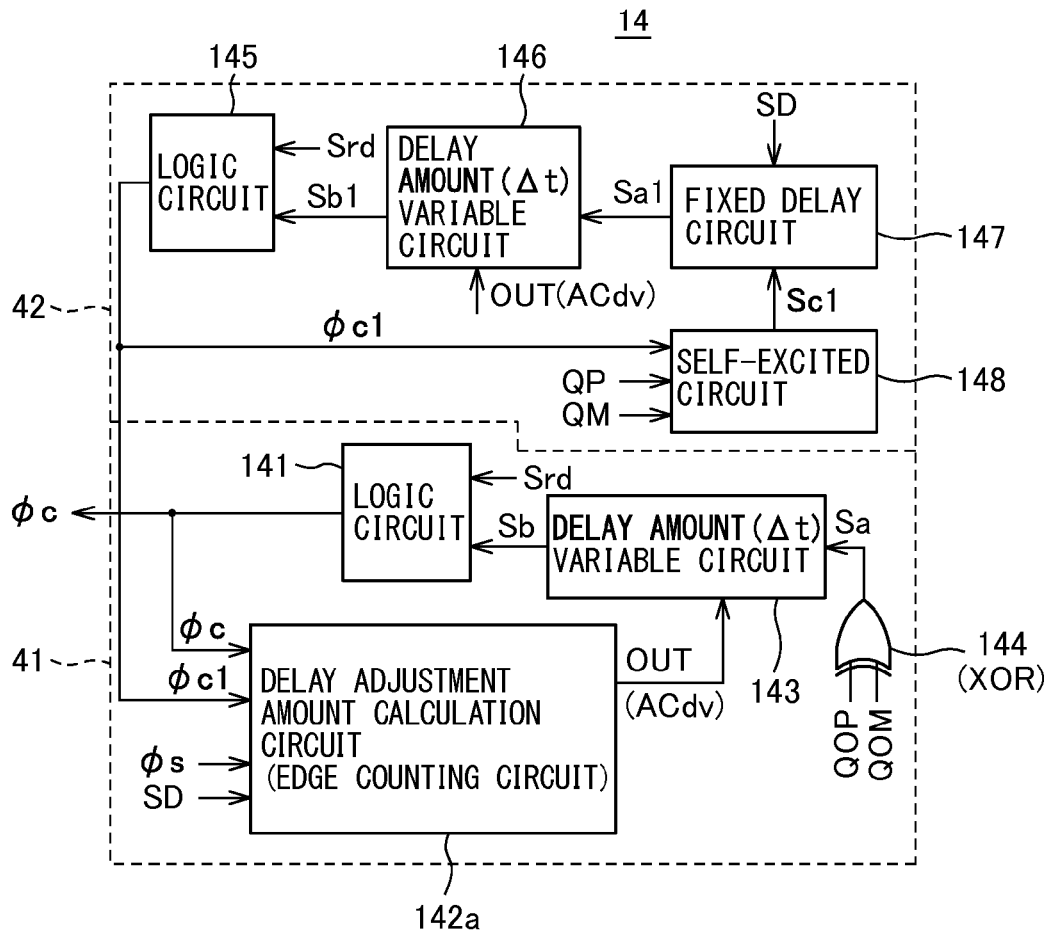
FIG. 7 is a block diagram illustrating a clock generation circuit (asynchronous clock generation circuit) according to a first embodiment.

An embodiment of a clock generation circuit, a successive comparison A/D converter, and an integrated circuit will be described in detail below with reference to the accompanying drawings. FIG. 7 is a block diagram illustrating a clock generation circuit (asynchronous clock generation circuit) according to a first embodiment. In other words, the asynchronous clock generation circuit depicted in FIG. 7 can be employed as the asynchronous clock generation circuit 14 in the successive comparison A/D converter 1 depicted in FIG. 1, mentioned earlier.

As is obvious from a comparison of FIG. 7 with FIG. 2, mentioned earlier, the asynchronous clock generation circuit 14 according to the first embodiment includes an asynchronous clock generation circuit (main loop: a first loop circuit 41), as depicted in FIG. 2, and a sub-loop (second loop circuit 42) including a longer self-excitation (clock) period.

The first loop circuit 41 includes a logic circuit 141, a delay adjustment amount calculation circuit (edge counting circuit) 142a, an XOR circuit 144, and a delay amount ($\Delta t$) variable circuit 143, as in FIG. 2 described earlier.

An external clock $\phi s$ and a pulse signal (first asynchronous clock: first clock) $\phi c$ from the logic circuit 141 are input to the delay adjustment amount calculation circuit 142a. A fixed delay code SD and a pulse signal (second asynchronous clock: second clock) $\phi c1$ from a logic circuit 145 are also input to the delay adjustment amount calculation circuit 142a.

The second loop circuit 42 includes the logic circuit 145, a delay amount ($\Delta t$) variable circuit 146, a fixed delay circuit (first fixed delay circuit) 147, and a self-excited circuit 148. The self-excited circuit 148 receives output voltages OP and OM of the CDAC 11 (input voltages of the comparator 12) and the second asynchronous clock $\phi c1$ from the logic circuit 145 and generates and outputs a signal Sc1 to the fixed delay circuit 147.

The delay amount variable circuit 146 includes a feature similar to the delay amount variable circuit 143, and receives a signal Sa1 output from the fixed delay circuit 147 and a delay amount adjustment code OUT(ACdv) from the delay adjustment amount calculation circuit 142a and generates and outputs a pulse signal Sb1 to the logic circuit 145.

The logic circuit 145 includes a feature similar to the logic circuit 141, and receives a ready signal Srd as in the logic circuit 141 of the first loop circuit 41 and the pulse signal Sb1 from the delay amount variable circuit 146 and outputs a second asynchronous clock 4c1.

In other words, the second asynchronous clock φc1 output from the second loop circuit 42 includes a period longer than that of the first asynchronous clock φc output from the first loop circuit 41. The amount of delay of the fixed delay circuit 147 is set in advance by a fixed delay code SD and remains the same during the circuit operation (during an A/D conversion process).

The amount of delay of the fixed delay circuit 147 set by the fixed delay code SD is preferably set to, for example, an integer multiple of (e.g., 10 or 20 times) the amount of delay of the delay adjustment amount calculation circuit 142a adjusted by the delay amount adjustment code OUT.

In other words, since the fixed delay circuit 147 is implemented in a configuration equivalent to that of the delay amount variable circuit 143 (146), the fixed delay code SD is set to 10 or 20 codes in the delay amount adjustment code OUT from the delay adjustment amount calculation circuit 142a.

As described with reference to FIG. 6A and FIG. 6B, the amount of delay Δt is adjusted in steps of one code by the delay amount adjustment code OUT, while the amount of delay can be adjusted by, for example, 10 or 20 codes by the fixed delay circuit 147.

When, for example, the magnitude of fluctuation in, for example, voltage or temperature is predictable under the environment in which the successive comparison A/D converter 1 is used, the value of the fixed delay code SD can be set based on the amount of delay occurring depending on the predictable magnitude of fluctuation.

As described above, according to the first embodiment, when the number of determination operations becomes insufficient upon an increase in amount of delay Δt of the first asynchronous clock φc due to a rapid change in, for example, voltage or temperature, the number of determination operations can be returned to an original value in a short period of time, based on the second asynchronous clock φc1 from the second loop circuit 42. Details will be described hereinafter with reference to FIG. 13 to FIG. 16.

Figure 8:
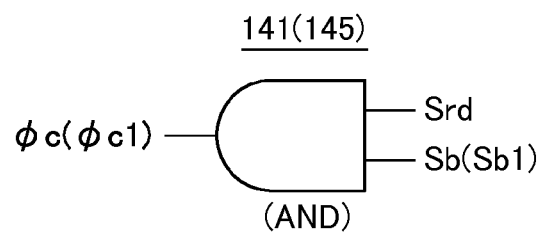
FIG. 8 is a circuit diagram illustrating an exemplary logic circuit in the asynchronous clock generation circuit depicted in FIG. 7.

FIG. 8 is a circuit diagram illustrating an example of the logic circuits 141 and 145 in the asynchronous clock generation circuit 14 depicted in FIG. 7. The logic circuits 141 and 145 include similar features and are implemented in an AND (logical AND) circuit.

In the AND circuit 141 (145), in response to, for example, a change of the ready signal Srd at one input terminal from "L" to "H," the level of the pulse signal Sb (Sb1) applied to the other input terminal passes intact and is directly output as the pulse signal φc (φc1).

In other words, when Srd is "H," the first asynchronous clock φc is φc=Sb and the second asynchronous clock φc1 is φc1=Sb1. Note, however, that the logic circuit 141 (145) depicted in FIG. 8 is merely an example and can be modified into various forms.

Figure 9:
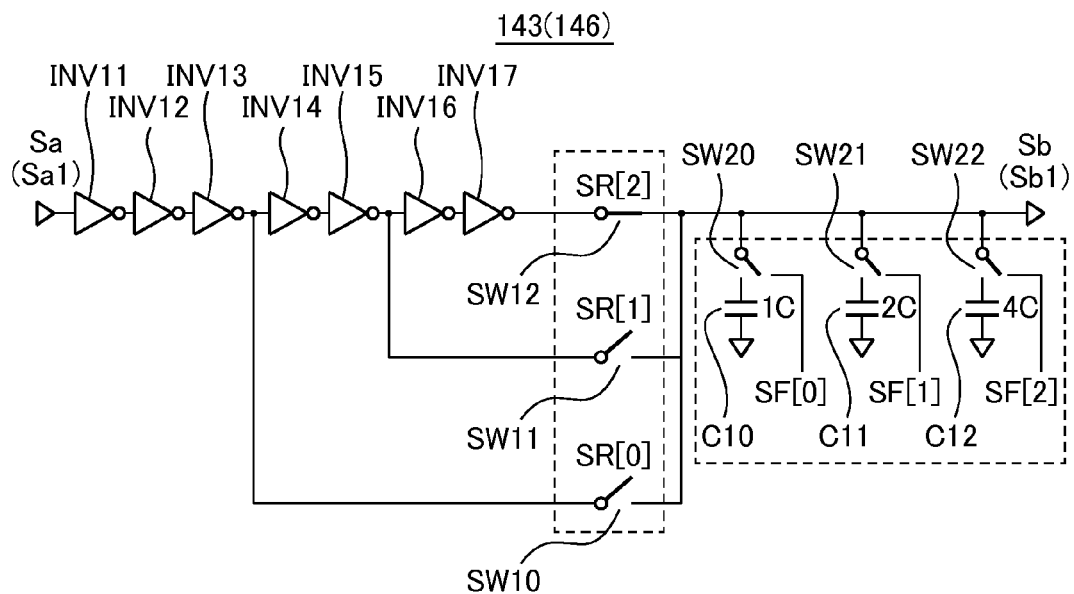
FIG. 9 is a circuit diagram illustrating an exemplary delay amount variable circuit in the asynchronous clock generation circuit depicted in FIG. 7.
Figure 10:
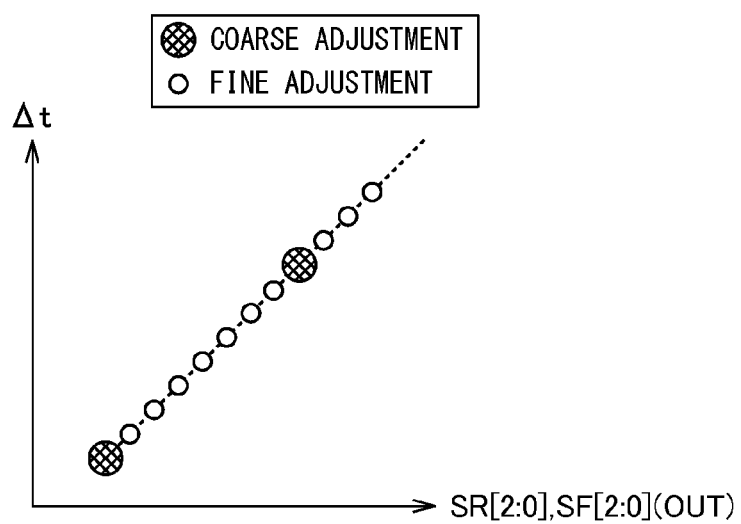
FIG. 10 is a graph for explaining the operation of the delay amount variable circuit depicted in FIG. 9.

FIG. 9 is a circuit diagram illustrating an example of the delay amount variable circuit 143 or 146 in the asynchronous clock generation circuit depicted in FIG. 7, and FIG. 10 is a graph for explaining the operation of the delay amount variable circuit depicted in FIG. 9.

The delay amount adjustment code OUT(ACdv) from the delay adjustment amount calculation circuit 142a is commonly applied to the delay amount variable circuit 143 of the first loop circuit (main loop) 41 and the delay amount variable circuit 146 of the second loop circuit (sub-loop) 42.

The delay amount variable circuit 143 (146) includes a plurality of series-connected inverters INV11 to INV17 which receive the output Sa of the XOR circuit 144 (the output Sa1 of the fixed delay circuit 147), switches SW10 to SW12 and SW20 to SW22, and capacitances C10 to C12, as depicted in FIG. 9. The switches SW10 to SW12 are controlled in switching by control signals SR[0] to SR[2] and the switches SW20 to SW22 are controlled in switching by control signals SF[0] to SF[2].

The control signals SR[0] to SR[2] and SF[0] to SF[2] are implemented using the signal OUT (delay amount adjustment code ACdv) output from the delay adjustment amount calculation circuit 142a. The amount of delay Δt is coarsely adjusted by controlling the number of stages of the inverters INV11 to INV17 in accordance with the control signals SR[0] to SR[2], as depicted in FIG. 10.

The amount of delay Δt is finely adjusted by controlling the connection of the capacitances C10 to C12 in accordance with the control signals SF[0] to SF[2]. The capacitances of the capacitances C10, C11, and C12 are set to, for example, 1C, 2C, and 4C and changed to various values to finely adjust the amount of delay by controlling the switches SW20 to SW22 in accordance with the control signals SF[0] to SF[2].

More specifically, when, for example, a control signal (delay amount adjustment code) SR[2]=1 ("H"), SR[1:0]=0 ("L"), and SF[2:0]=1 are set, a maximum number of stages of inverters are used (INV11 to INV17) and maximum fine adjustment capacitances C10 to C12 are also used (1C+2+4C=7C), resulting in a maximum amount of delay.

When, for example, SR[2:1]=0, SR[0]=1, and SF[2:0]=0 are set, a minimum number of stages of inverters are used (INV11 to INV13) and the fine adjustment capacitances C10 to C12 are not connected, resulting in a minimum amount of delay. The delay amount variable circuit 143 (146) depicted in FIG. 9 is merely an example and can be modified and changed into various forms.

FIG. 11 is a circuit diagram illustrating an example of the fixed delay circuit 147 in the asynchronous clock generation circuit depicted in FIG. 7. As is obvious from a comparison of FIG. 11 with FIG. 9, mentioned earlier, the fixed delay circuit 147 includes the same configuration as the delay amount variable circuit 143 (146), while each switch is fixed to generate a fixed amount of delay during the circuit operation (during an A/D conversion process).

In other words, the fixed delay circuit 147 includes a plurality of series-connected inverters INV21 to INV27 which receive an output Sc of the self-excited circuit 148, switches SW30 to SW35, and capacitances C20 to C22, as depicted in FIG. 11.

The switches SW30 to SW32 are controlled in switching by control signals SD[0] to SD[2] and the switches SW33 to SW35 are controlled in switching by control signals SD[3] to SD[5]. The control signals SD[0] to SD[5] are implemented using the externally input, fixed delay code SD, and remain the same while the switches SW30 to SW35 are fixed to generate a fixed amount of delay during the circuit operation.

The fixed delay circuit 147 includes the same configuration as the delay amount variable circuit 143 (146) in order to, for example, uniform a change in amount of delay in each individual circuit upon fluctuations in, for example, voltage and temperature.

FIGS. 12A and 12B are diagrams illustrating two exemplary self-excited circuits 148 each provided in the asynchronous clock generation circuit depicted in FIG. 7.

The self-excited circuit 148 depicted in FIG. 12A includes a comparator 1481 corresponding to the comparator 12 of the successive comparison A/D converter 1 depicted in FIG. 1, and an XOR circuit 1482 corresponding to the XOR circuit 144 of the first loop circuit 41 depicted in FIG. 7. The comparator 1481 executes a comparison operation using, as inputs, analog voltages OP and OM serving as the outputs of the CDAC 11. The output of the comparator 1481 is input to the XOR circuit 1482.

With this operation, an output Sc1 corresponding to the output Sa of the XOR circuit 144 in the first loop circuit 41 is generated and output to the fixed delay circuit 147. A reset signal for the comparator 1481 is implemented using the second asynchronous clock (pulse signal) φc1 from the logic circuit 145 in the second loop circuit 42.

The self-excited circuit 148 depicted in FIG. 12B includes a plurality of series-connected inverters INV31 to INV3n, which delay the second asynchronous clock φc1 from the logic circuit 145 to generate an output Sc1. The number of inverters INV31 to INV3n that delay the second asynchronous clock φc1 is set so as to obtain the same delay time as in the self-excited circuit described with reference to FIG. 12A.

The signals Sc1 generated by the self-excited circuits 148, as depicted in FIG. 12A and FIG. 12B, are input to the fixed delay circuit 147. The self-excited circuit 148 is not limited to those represented in FIG. 12A and FIG. 12B as long as an amount of delay equal to the delay time of the comparator 12 and XOR circuit 144 can be generated, as a matter of course.

Figure 13:
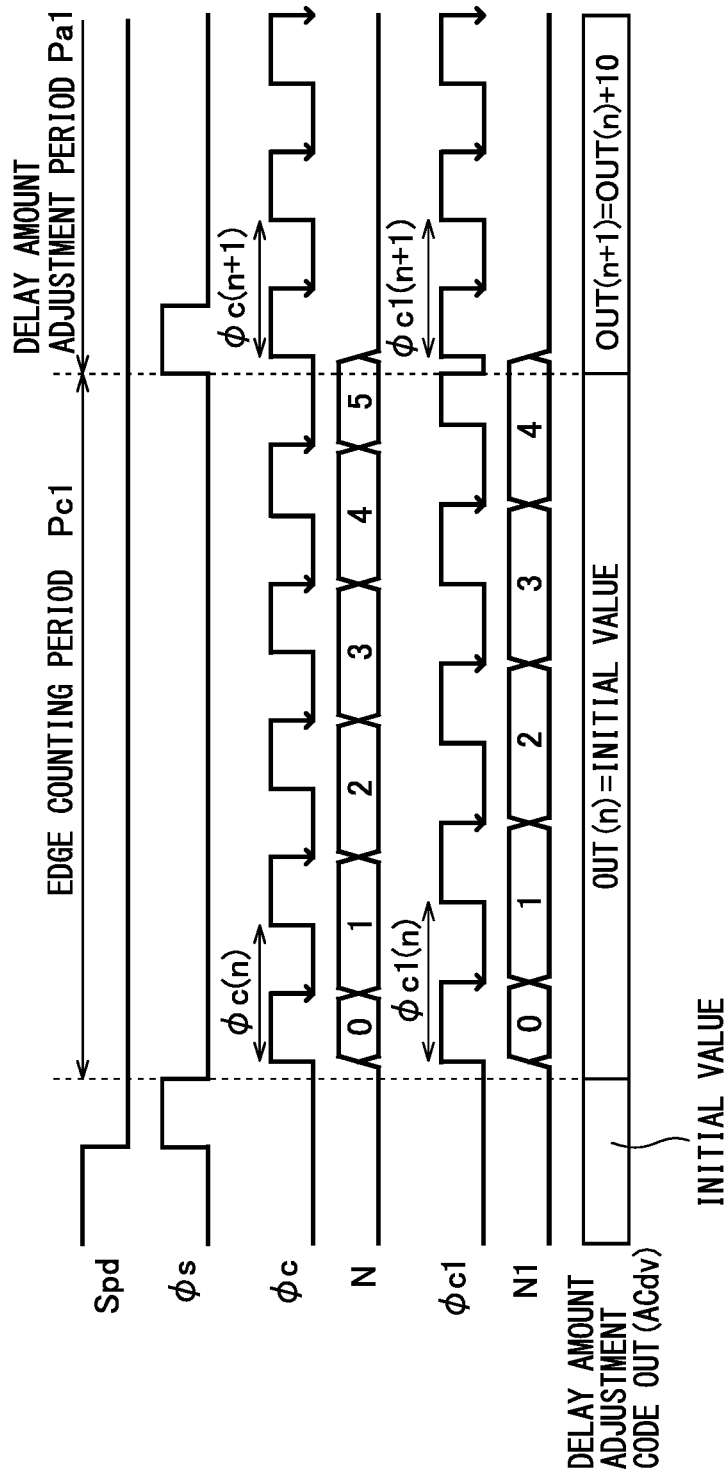
FIG. 13 is a timing chart for explaining the operation of the asynchronous clock generation circuit according to the first embodiment.

FIG. 13 is a timing chart for explaining the operation of the asynchronous clock generation circuit according to the first embodiment, and illustrates this operation when, for example, the count value N of the first asynchronous clock φc is 5 and the count value N1 of the second asynchronous clock φc1 is changed to 4 due to rapid changes in, for example, voltage and temperature.

The count value N is obtained by counting the number of falling edges of the first asynchronous clock φc using a counter 21 to be described later with reference to FIG. 14. The count value N1 is obtained by counting the number of falling edges of the second asynchronous clock φc1 using a counter 22.

In the example depicted in FIG. 13, the resolution of the successive comparison A/D converter 1 is 4 bits and the loop operating frequency is appropriate when N=4. Therefore, N=5 means that the loop operating frequency (i.e., the frequency of the asynchronous clock φc serving as the operation clock of the comparator 12) is high (the amount of delay Δt is small). In this case, the adjustment code is increased to prolong the periods of the asynchronous clocks φc and φc1 (increase the amount of delay Δt) and thereby adjust the count value N to "4," which is equal to the resolution. The fixed delay code SD is set to, for example, SD=10 in advance.

As represented in FIG. 13, in an edge counting period Pc1, when the delay amount adjustment code OUT(ACdv) is OUT (n)=Initial Value and the count value N of the first asynchronous clock φc is "5," the count value N1 of the second asynchronous clock φc1 is "4."

At this time, in the next delay amount adjustment period Pa1, determination operations are controlled based on the second asynchronous clock 4c1 so that the delay amount adjustment code OUT is set to OUT(n+1)=OUT(n)+10 and four determination operations are performed.

From a relation among N=5, N1=4, and SD=10, for example, in the delay amount adjustment period Pa1, the adjustment code is set to "+10" to obtain N=4 and the adjustment is completed. When N=6 and N1=5, for example, in the delay amount adjustment period Pa1, N=4 is obtained upon setting of the adjustment code to "+20" and the adjustment is completed.

As described above, according to the first embodiment, for example, the adjustment code described with reference to FIG. 6B is changed by "+1" while the time taken for adjustment (adjustment period) is shortened to about ¹⁄₁₀ so as to automatically set an appropriate loop operating frequency.

Figure 14:
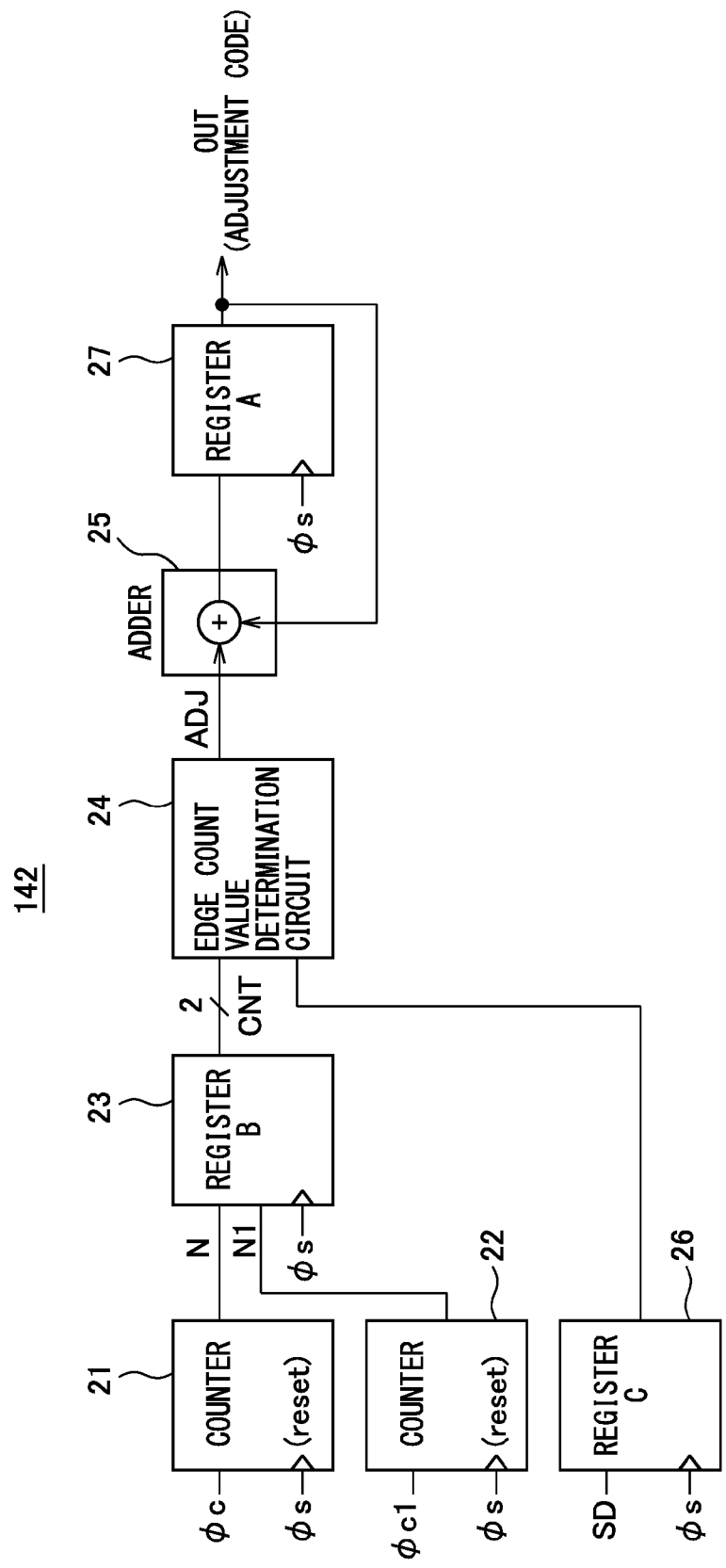
FIG. 14 is a block diagram illustrating an exemplary delay adjustment amount calculation circuit in the asynchronous clock generation circuit depicted in FIG. 7.

FIG. 14 is a block diagram illustrating an exemplary delay adjustment amount calculation circuit in the asynchronous clock generation circuit depicted in FIG. 7, and illustrates an exemplary configuration of the delay adjustment amount calculation circuit 142a that performs a process of calculating a delay amount adjustment code to be described later with reference to FIG. 15 and FIG. 16.

The delay adjustment amount calculation circuit 142a includes the counters 21 and 22, registers 23, 26, and 27, an edge count value determination circuit 24, and an adder 25, as depicted in FIG. 14. The counter 21 counts in response to falling edges of the first asynchronous clock φc from the first loop circuit 41, and the counter 22 counts in response to falling edges of the second asynchronous clock φc1 from the second loop circuit 42.

The counters 21 and 22 are reset and execute no count operation during a period in which a clock signal (external clock) φs is "H" (delay amount adjustment period) and a count operation during a period in which the external clock φs is "L" (edge counting period).

In other words, in the edge counting period (Pc1), the counter 21 counts the number of falling edges of the first asynchronous clock φc and the counter 22 counts the number of falling edges of the second asynchronous clock φc1. At the end of the edge counting period, the output N of the counter 21 and the output N1 of the counter 22 are stored in the register 23 (register B).

On the other hand, in the delay amount adjustment period (Pa1), values based on the two edge count values N and N1 and the fixed delay code SD are processed to generate an amount of change in adjustment code ADJ and output it to the adder 25, as will be described in more detail with reference to FIG. 15 and FIG. 16.

The fixed delay code SD is stored in the register 26 (register C) and output to the edge count value determination circuit 24, together with an output CNT (N, N1) of the register 23. The adder 25 adds up ADJ from the edge count value determination circuit 24 and the output (adjustment code) OUT of the register 27 (register A), writes the result over the register A, and stores it. The registers 23, 26, and 27 are set to initial values by the power-down signal Spd at, for example, the start of operation.

Figure 15:
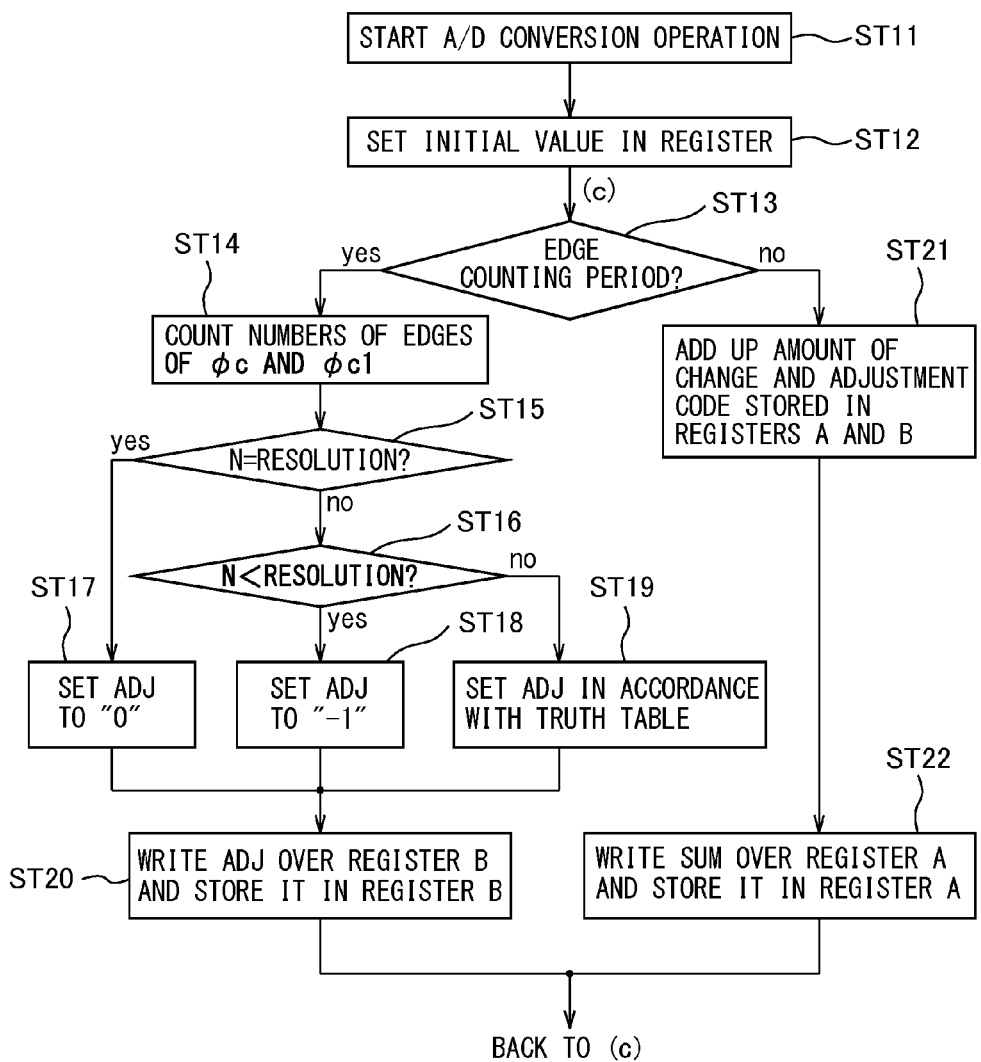
FIG. 15 is a flowchart for explaining an exemplary process of calculating a delay amount adjustment code in the asynchronous clock generation circuit depicted in FIG. 7.

FIG. 15 is a flowchart for explaining an exemplary process of calculating a delay amount adjustment code in the asynchronous clock generation circuit depicted in FIG. 7, and FIG. 16 illustrates an exemplary truth table in the process of calculating a delay amount adjustment code depicted in FIG. 15.

Referring to FIG. 15 and FIG. 16, as described with reference to FIG. 14, N is the count value of falling edges of the first asynchronous clock φc from the first loop circuit 41, and N1 is the count value of falling edges of the second asynchronous clock φc1 from the second loop circuit 42.

The register B (register 23) is used to store the edge count values N and N1, the register C (register 26) is used to store the fixed delay code SD, and the register A (register 27) is used to store the adjustment code OUT.

As depicted in FIG. 15, in step ST11, when an A/D conversion operation is started, the registers A, B, and C depicted in FIG. 14 are set to initial values by the external clock φs (ST12).

The process advances to step ST13, in which it is determined whether the current period is the edge counting period (Pc1). If it is determined in step ST13 that the current period is the edge counting period (Yes), the numbers of falling edges of φc and φc1 are counted by the counters 21 and 22, respectively (step ST14).

The process advances to step ST15, in which it is determined whether the edge count value N is equal to the resolution of the A/D converter. This is done because the edge count value N is preferably set equal to the resolution of the A/D converter in most cases.

More specifically, when, for example, a successive comparison A/D converter including a resolution of 8 bits is used, N=Resolution holds true for N=8 (Yes in step ST15). In this case, since the loop operating frequency is appropriate, the amount of change in adjustment code ADJ is set to "0" (step ST17).

If it is determined in step ST15 that N=Resolution does not hold (No in step ST15), the process advances to step ST16, in which it is determined whether N<Resolution holds. If it is determined in step ST16 that N<Resolution holds (Yes), for example, ADJ is set to "−1" (step ST18). This process corresponds to the process described with reference to FIG. 6A.

On the other hand, if it is determined in step ST16 that N<Resolution does not hold (No), the process advances to step ST19, in which, for example, ADJ is set in accordance with the truth table as depicted in FIG. 16, i.e., ADJ is set to "+SD" or "+2×SD."

More specifically, as depicted in FIG. 16, when, for example, N1−Resolution=0 holds true for N−Resolution=1, N1−Resolution=1 holds true for N−Resolution=1, and N1−Resolution=0 holds true for N−Resolution=2, ADJ is set to "+SD (e.g., +10)." Further, when, for example, N1−Resolution=1 holds true for N−Resolution=2, and N1−Resolution=2 holds true for N−Resolution=2, ADJ is set to "+2×SD (e.g., +20)."

The process advances to step ST20, in which the values of ADJ set in steps ST17, ST18, and ST19 are written over the register B and stored in it. The process then returns to step ST13, in which the same processes are repeated.

If it is determined in step ST13 that the current period is not the edge counting period (Pc1), for example, the amount of delay is adjusted as the delay amount adjustment period (Pa1). In other words, the process advances to step ST21, in which the amount of change and the adjustment code stored in the registers A and B are added up and the process advances to step ST22.

In step ST22, the sum is written over the register A and stored in it. The process then returns to step ST13, in which the same processes are repeated. In other words, the adder 25 adds up ADJ from the edge count value determination circuit 24 and the adjustment code OUT from the register 27, writes the result over the register 27, and stores it. The same processes are then repeated.

The fixed delay code SD is set to a value (e.g., "+10" or "+20") larger than "+1" in advance. Therefore, an appropriate loop operating frequency can be obtained in a shorter period of time than when, for example, the amount of delay Δt is adjusted in steps of "+1" described with reference to FIG. 6B.

Since the adjustment code OUT and the amount of delay Δt are proportional to each other, the adjustment code OUT and the loop operating frequency are inversely proportional to each other, as described with reference to FIG. 10. Accordingly, when the amount of change in adjustment code is "+1," the amount of delay Δt increases so that the loop operating frequency lowers; otherwise, i.e., when this amount of change is "−1," the amount of delay Δt decreases so that the loop operating frequency increases.

As described above, according to the first embodiment, when, for example, the count value is larger than the resolution, the loop operating frequency is high and ADJ is therefore set based on the fixed delay code SD to lower the loop operating frequency to an appropriate value in a short period of time. When the count value N is smaller than the resolution, the loop operating frequency is low and ADJ is therefore set to "−1," as described with reference to FIG. 6A.

Figure 17:
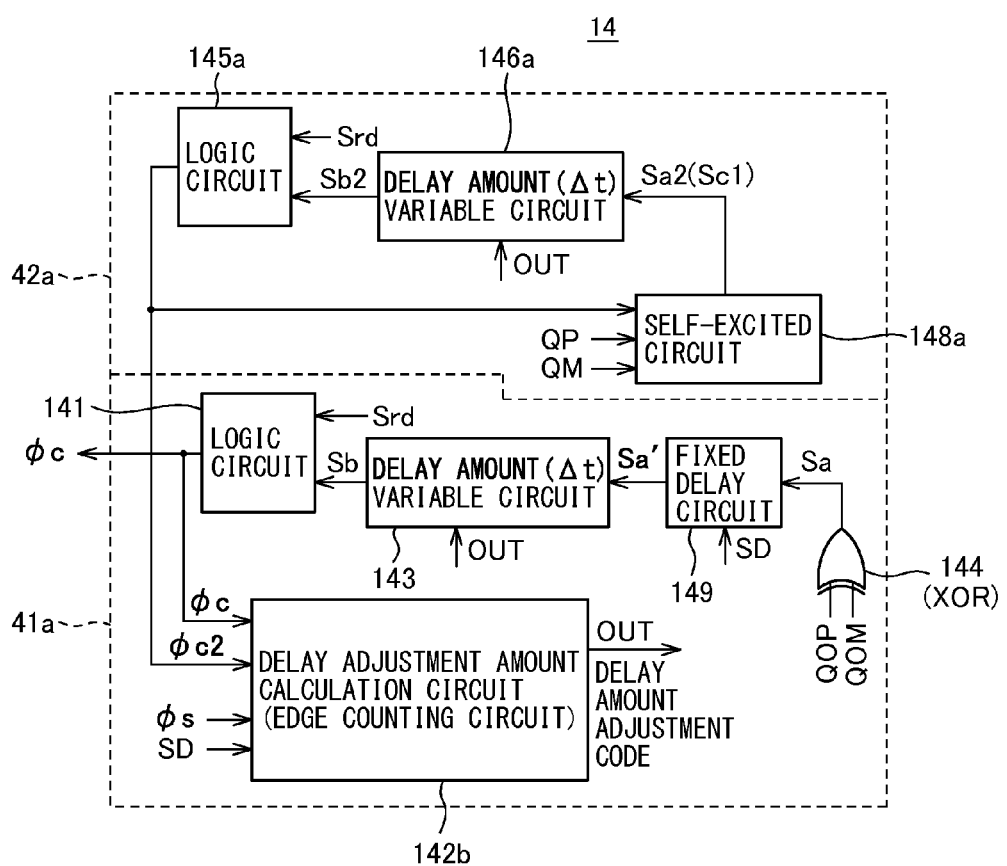
FIG. 17 is a block diagram illustrating a clock generation circuit (asynchronous clock generation circuit) according to a second embodiment.

FIG. 17 is a block diagram illustrating a clock generation circuit (asynchronous clock generation circuit) according to a second embodiment, which can be employed as the asynchronous clock generation circuit 14 in the successive comparison A/D converter 1 represented in FIG. 1, described above, as in FIG. 7. When the numerical value N is smaller than the resolution, the asynchronous clock generation circuit according to the second embodiment sets ADJ based on a fixed delay code SD to increase the loop operating frequency to an appropriate value in a short period of time.

As is obvious from a comparison of FIG. 17 with FIG. 7, mentioned earlier, in the asynchronous clock generation circuit 14 illustrated in the second embodiment, a first loop circuit 41a includes a fixed delay circuit (second fixed delay circuit) 149 and a second loop circuit 42a includes no fixed delay circuit (147).

In other words, in the first loop circuit (main loop) 41a, an output Sa of an XOR circuit 144 is delayed based on the fixed delay code SD by the fixed delay circuit 149, and a signal Sa' obtained upon the delay is input to a delay amount variable circuit 143. On the other hand, in the second loop circuit (sub-loop) 42a, an output Sat (Sc1) of a self-excited circuit 148a is directly input to a delay amount variable circuit 146a.

With this operation, as described with reference to FIG. 6B, ADJ is set to "+1" when the count value N is larger than the resolution and is set based on the fixed delay code SD when the count value N is smaller than the resolution.

In other words, a first asynchronous clock φc from the first loop circuit 41a and a second asynchronous clock φc2 from the second loop circuit 42a include a relation (period): φc>φc2. A delay adjustment amount calculation circuit 142b according to the second embodiment includes its input changed from φc1 to φc2 but can practically be implemented in the delay adjustment amount calculation circuit 142 according to the first embodiment. However, a delay amount adjustment code is calculated in a way as will be described later with reference to FIG. 19 and FIG. 20.

Figure 18:
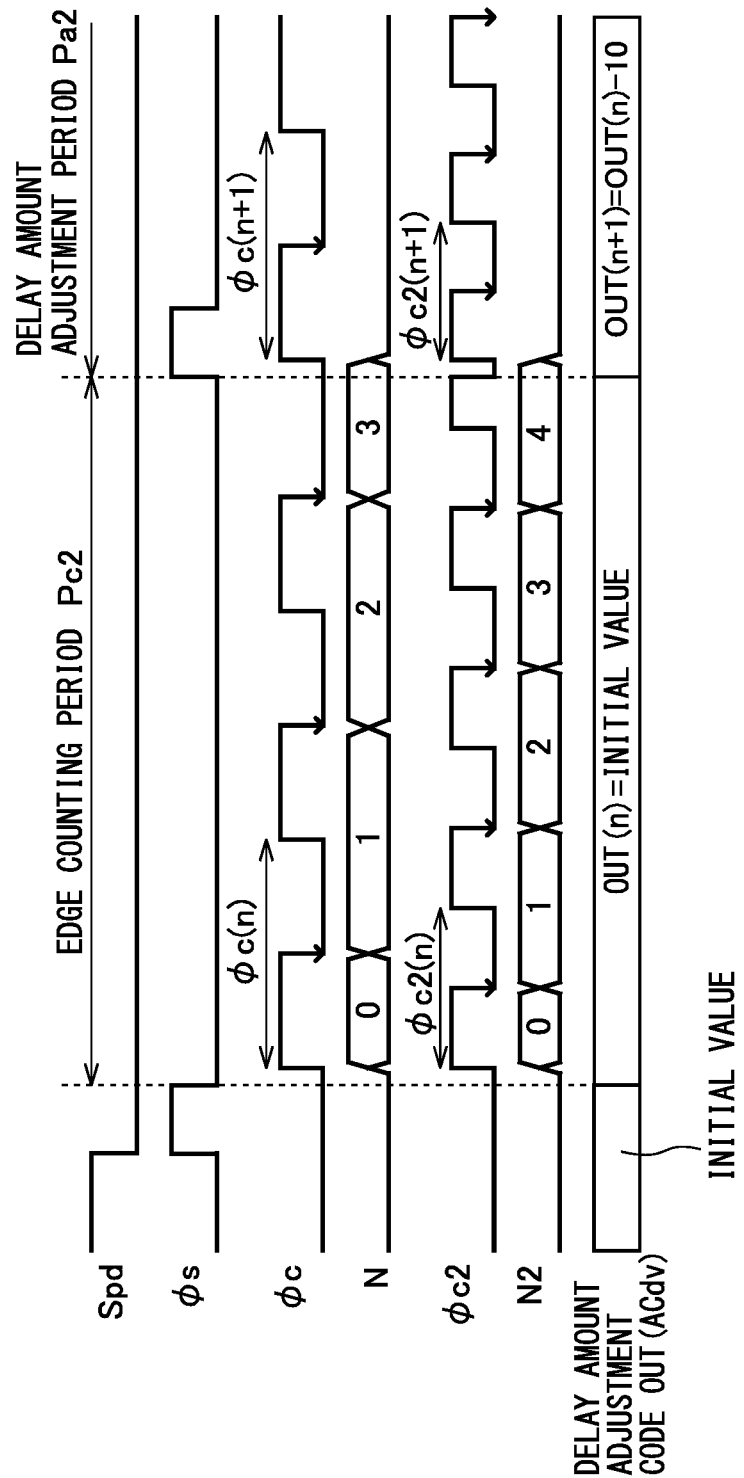
FIG. 18 is a timing chart for explaining the operation of the asynchronous clock generation circuit according to the second embodiment.

FIG. 18 is a timing chart for explaining the operation of the asynchronous clock generation circuit according to the second embodiment, and illustrates this operation when, for example, the count value N of the first asynchronous clock φc is 3 and the count value N2 of the second asynchronous clock φc2 is changed to 4 due to rapid changes in, for example, voltage and temperature.

As is obvious from a comparison of FIG. 18 with FIG. 13, mentioned earlier, in the example depicted in FIG. 18, the resolution of the successive comparison A/D converter 1 is 4 bits and the loop operating frequency is appropriate when N=4. Therefore, N=3 means that the loop operating frequency (i.e., the frequency of the asynchronous clock φc serving as the operation clock of a comparator 12) is low (the amount of delay Δt is large). In this case, a negative adjustment code is increased to shorten the periods of the asynchronous clocks φc and φc2 (decrease the amount of delay Δt) and thereby adjust the count value N to "4," which is equal to the resolution.

As represented in FIG. 18, in an edge counting period Pc2, when a delay amount adjustment code OUT is OUT(n)=Initial Value and the count value N of the first asynchronous clock φc is "3," the count value N2 of the second asynchronous clock φc2 is "4."

At this time, in the next delay amount adjustment period Pa2, determination operations are controlled based on the second asynchronous clock φc2 so that the delay amount adjustment code OUT is set to OUT(n+1)=OUT(n)−10 and four determination operations are performed.

From a relation among N=3, N2=4, and SD=10, for example, in the delay amount adjustment period Pa2, the adjustment code is set to "−10" to obtain N=4 and the adjustment is completed. When N=2 and N2=3, for example, in the delay amount adjustment period Pa2, N=4 is obtained upon setting of the adjustment code to "−20" and the adjustment is completed.

As described above, according to the second embodiment, for example, the adjustment code described with reference to FIG. 6A is changed by "−1" while the adjustment period is shortened to about 1/10 so as to automatically set an appropriate loop operating frequency.

A configuration equivalent to the delay adjustment amount calculation circuit 142a depicted in FIG. 14, mentioned earlier, is applicable to the delay adjustment amount calculation circuit 142b according to the second embodiment. However, as in a truth table depicted in FIG. 20 (to be described later), a comparison between the resolution and the count value N2 of falling edges of the second asynchronous clock φc2 from the second loop circuit 42a uses "Resolution−N2" in place of "N1−Resolution" in the truth table represented in FIG. 16.

Figure 19:
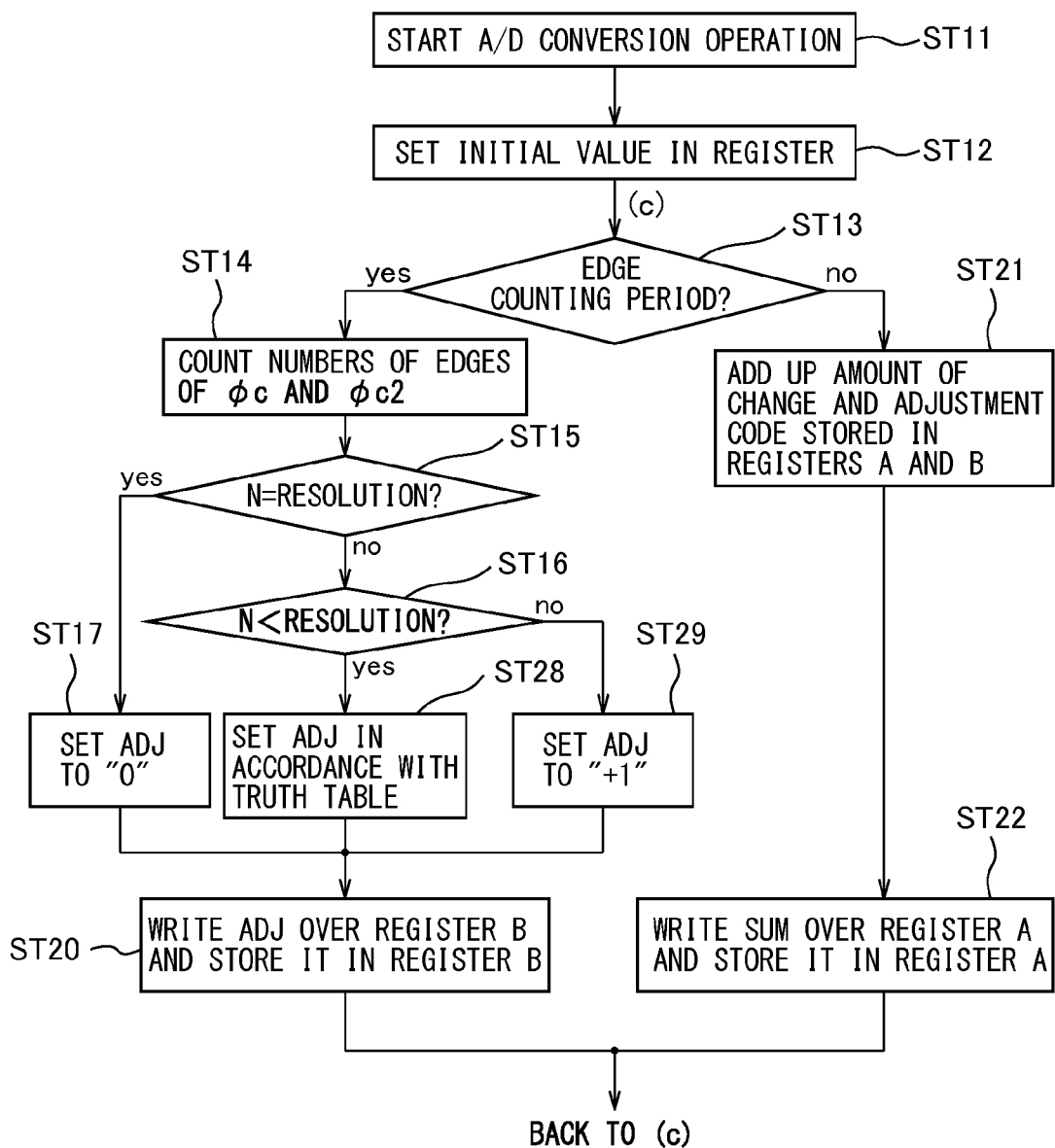
FIG. 19 is a flowchart for explaining an exemplary process of calculating a delay amount adjustment code in the asynchronous clock generation circuit depicted in FIG. 17.

FIG. 19 is a flowchart for explaining an exemplary process of calculating a delay amount adjustment code in the asynchronous clock generation circuit depicted in FIG. 17, and FIG. 20 illustrates an exemplary truth table in the process of calculating a delay amount adjustment code depicted in FIG. 19. As is obvious from a comparison of FIG. 19 with FIG. 15, mentioned earlier, steps ST18 and ST19 in FIG. 15 are replaced with steps ST28 and ST29 in FIG. 19.

In other words, if it is determined in step ST16 that N<Resolution holds (Yes), the process advances to step ST28, in which, for example, ADJ is set in accordance with the truth table as depicted in FIG. 20, i.e., ADJ is set to "−SD" or "−2×SD."

More specifically, as depicted in FIG. 20, when, for example, Resolution−N2=0 holds true for N−Resolution=1, Resolution−N2=1 holds true for N−Resolution=1, and Resolution−N2=0 holds true for N−Resolution=2, ADJ is set to "−SD (e.g., −10)." Further, when, for example, Resolution−N2=1 holds true for N−Resolution=2, and Resolution−N2=2 holds true for N−Resolution=2, ADJ is set to "−2×SD (e.g., −20)."

On the other hand, if it is determined in step ST16 that N<Resolution does not hold (No), the process advances to step ST29, in which ADJ is set to "+1." This process corresponds to the process described with reference to FIG. 6B. Other processes are the same as in the process of the flowchart depicted in FIG. 15.

As described above, according to the second embodiment, when, for example, the count value is smaller than the resolution, the loop operating frequency is low and ADJ is therefore set based on the fixed delay code SD to increase the loop operating frequency to an appropriate value in a short period of time. When the count value N is larger than the resolution, the loop operating frequency is high and ADJ is therefore set to "+1," as described with reference to FIG. 6B.

Figure 21:
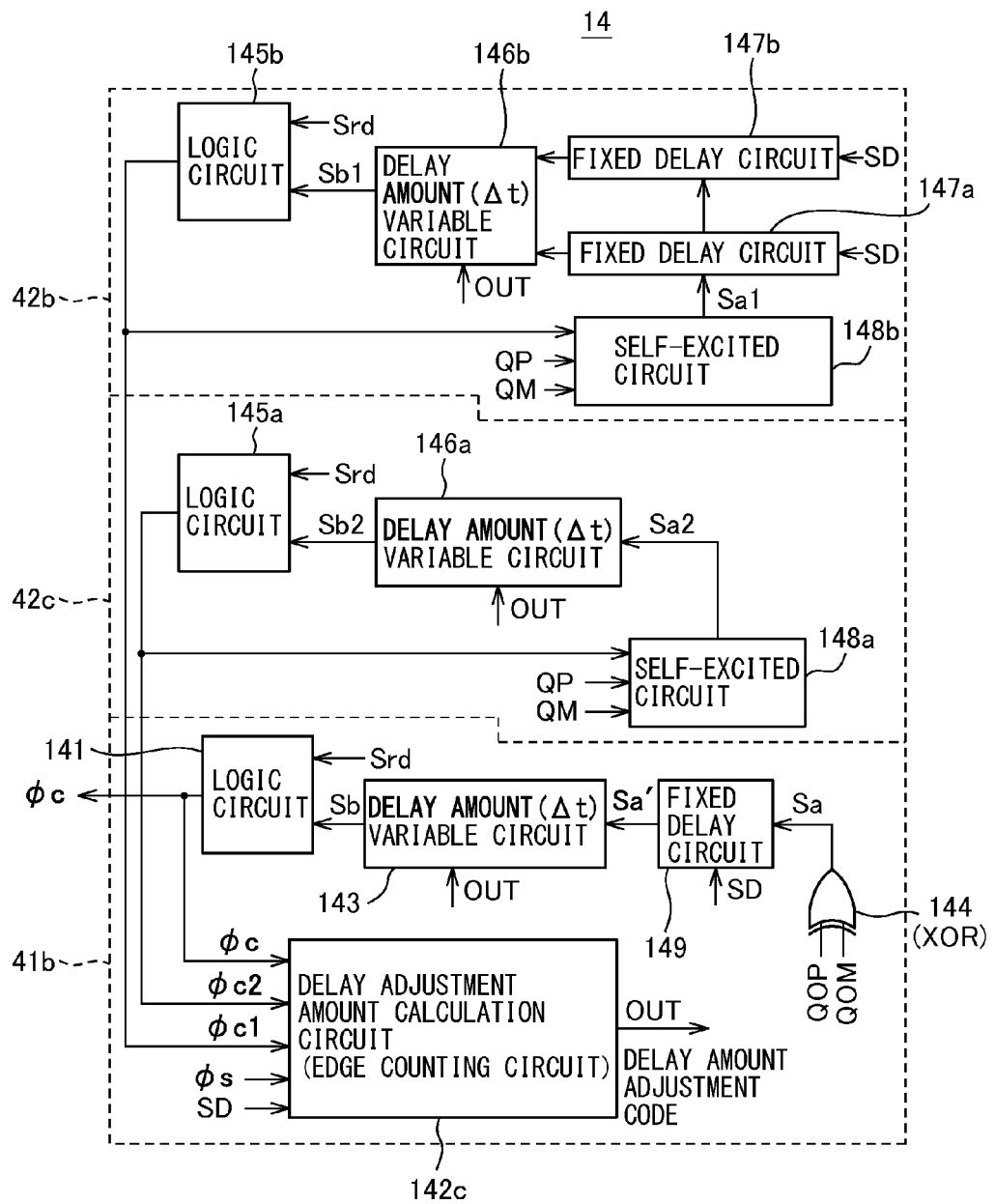
FIG. 21 is a block diagram illustrating a clock generation circuit (asynchronous clock generation circuit) according to a third embodiment.

FIG. 21 is a block diagram illustrating a clock generation circuit (asynchronous clock generation circuit) according to a third embodiment and corresponds to a combination of the above-mentioned first and second embodiments. As in the above-mentioned first and second embodiments, the asynchronous clock generation circuit depicted in FIG. 21 can also be employed as the asynchronous clock generation circuit 14 in the successive comparison A/D converter 1 depicted in FIG. 1.

In the third embodiment, a first loop circuit (main loop) 41b includes a fixed delay circuit (third fixed delay circuit) 149 and a second loop circuit (sub-loop) includes a first sub-loop circuit 42b and a second sub-loop circuit 42c.

The first sub-loop circuit 42b generates a first asynchronous sub-clock (first sub-clock) φc1 and the second sub-loop circuit 42c generates a second asynchronous sub-clock (second sub-clock) φc2.

In other words, as is obvious from a comparison of FIG. 21 with FIG. 7, the first loop circuit 41b and the first sub-loop circuit 42b according to the third embodiment correspond to the first loop circuit 41 and the second loop circuit 42 according to the first embodiment.

However, the third embodiment depicted in FIG. 21 includes a characteristic feature in terms of providing the fixed delay circuit 149 in the first loop circuit 41 of the first embodiment, and providing two fixed delay circuits (fourth fixed delay circuits) 147a and 174b in the second loop circuit 42 of the first embodiment.

In other words, according to the third embodiment, the first loop circuit 41b includes the fixed delay circuit 149, which applies an amount of delay based on a fixed delay code SD to a first asynchronous clock φc. With this arrangement, the first sub-loop circuit 42b includes the two fixed delay circuits 147a and 174b, which apply an amount of delay based more on the fixed delay code SD to the first asynchronous sub-clock φc1 than to the first asynchronous clock φc.

As is obvious from a comparison of FIG. 21 with FIG. 17, the first loop circuit 41b and the second sub-loop circuit 42c according to the third embodiment depicted in FIG. 21 correspond to the first loop circuit 41a and the second loop circuit 42a according to the second embodiment depicted in FIG. 17.

As described above, according to the third embodiment, the asynchronous clock generation circuit 14 depicted in FIG. 21 can set ADJ based on SD when the count value is larger than the resolution in the first embodiment, and set ADJ based on SD when the count value is smaller than the resolution in the second embodiment. In other words, according to the third embodiment, the adjustment period can be shortened regardless of whether the edge count value N of the first asynchronous clock 4c1 is excessive or insufficient.

As described in detail above, according to each embodiment, even when the number of determination operations (edge count value) becomes different from the resolution due to rapid changes in, for example, voltage and temperature, the amount of delay can be adjusted in a short period of time to make the number of determination operations equal to the resolution, thus achieving a stable A/D conversion accuracy.

Figure 22:
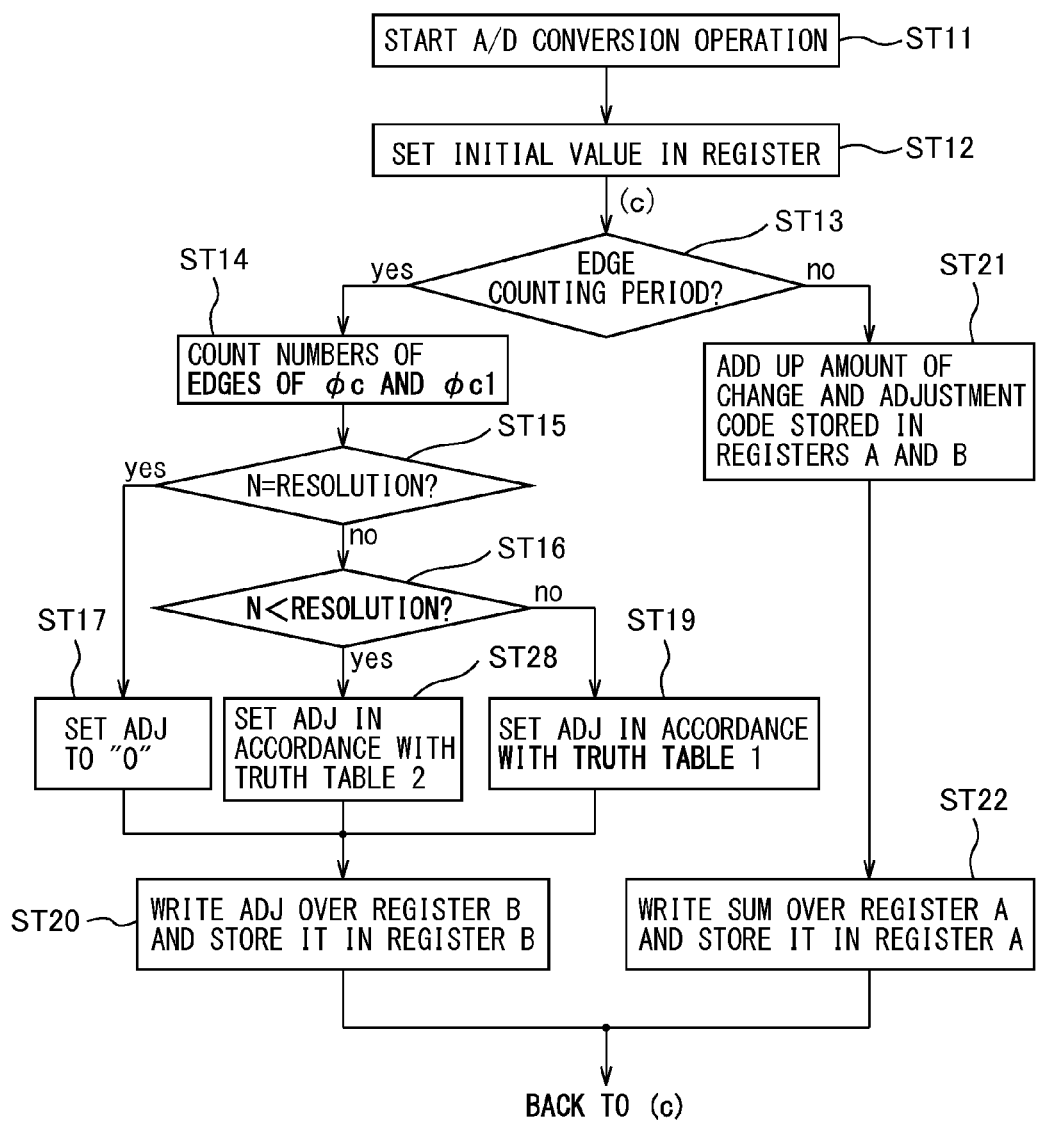
FIG. 22 is a flowchart for explaining an exemplary process of calculating a delay amount adjustment code in the asynchronous clock generation circuit depicted in FIG. 21.

FIG. 22 is a flowchart for explaining an exemplary process of calculating a delay amount adjustment code in the asynchronous clock generation circuit depicted in FIG. 21, and FIG. 23A and FIG. 23B are diagrams illustrating exemplary truth tables in the process of calculating a delay amount adjustment code depicted in FIG. 22.

As is obvious from a comparison of FIG. 22 with FIG. 19 and FIG. 15, mentioned above, in the process of the third embodiment depicted in FIG. 22, the process in step ST19 of the first embodiment depicted in FIG. 15 and the process in step ST28 of the second embodiment depicted in FIG. 19 are executed. Truth table 1 depicted in FIG. 23A is identical to the truth table represented in FIG. 16, and truth table 2 depicted in FIG. 23B is identical to the truth table represented in FIG. 20.

In other words, referring to FIG. 22, as in FIG. 19, if it is determined in step ST16 that N<Resolution holds (Yes), the process advances to step ST28. In step ST28, for example, ADJ is set in accordance with truth table 2 as depicted in FIG. 23B, i.e., ADJ is set to "−SD" or "−2×SD."

More specifically, as illustrated in FIG. 23B, when, for example, Resolution−N2=0 holds true for N−Resolution=1, Resolution−N2=1 holds true for N−Resolution=1, and Resolution−N2=0 holds true for N−Resolution=2, ADJ is set to "−SD (e.g., −10)." Further, when, for example, Resolution−N2=1 holds true for N−Resolution=2, and Resolution−N2=2 holds true for N−Resolution=2, ADJ is set to "−2×SD (e.g., −20)."

On the other hand, if it is determined in step ST16 that N<Resolution does not hold (No), the process advances to step ST19, in which, for example, ADJ is set in accordance with the truth table as depicted in FIG. 23A, i.e., ADJ is set to "+SD" or "+2×SD."

More specifically, as illustrated in FIG. 23A, when, for example, N1−Resolution=0 holds true for N−Resolution=1, N1−Resolution=1 holds true for N−Resolution=1, and N1−Resolution=0 holds true for N−Resolution=2, ADJ is set to "+SD (e.g., +10)." Further, when, for example, N1−Resolution=1 holds true for N−Resolution=2, and N1−Resolution=2 holds true for N−Resolution=2, ADJ is set to "+2×SD (e.g., +20)."

The process advances to step ST20, in which the values of ADJ set in steps ST17, ST28, and ST19 are written over a register B and stored in it. The process then returns to step ST13, in which the same processes are repeated.

The above-mentioned configurations of the clock generation circuits (asynchronous clock generation circuits) according to respective embodiments illustrated as, for example, FIG. 7, FIG. 17 and FIG. 21 are merely examples and can be modified and changed into various forms. In addition, the logics of respective signals described with reference to FIG. 13 and FIG. 18 are merely examples, as a matter of course.

Figure 24:
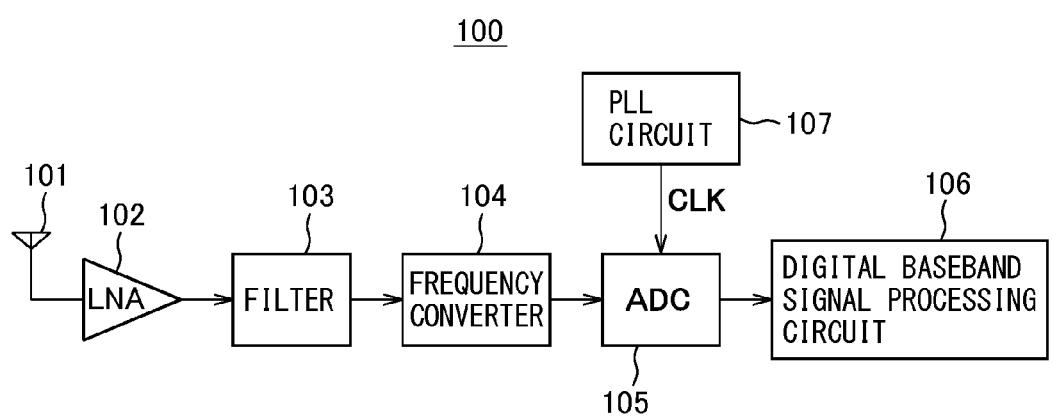
FIG. 24 is a block diagram illustrating an exemplary radio receiver to which the successive comparison A/D converter according to this embodiment is applied.

FIG. 24 is a block diagram illustrating an example of a radio receiver 100 to which the successive comparison A/D converter according to this embodiment is applied, and the successive comparison A/D converter according to this embodiment can be employed as an A/D converter (ADC) 105.

The radio receiver 100 includes an antenna 101, a low-noise amplifier (LNA) 102, a filter 103, a frequency converter 104, the A/D converter 105, a digital baseband signal processing circuit 106, and a PLL (Phase Locked Loop) circuit 107, as depicted in FIG. 24.

The radio receiver 100, for example, amplifies by the low-noise amplifier 102 a high-frequency signal received via the antenna 101, extracts predetermined frequency components via the filter 103, and converts (down-converts) the resultant signal into a baseband signal by the frequency converter 104.

The baseband signal from the frequency converter 104 is input to the A/D converter 105 controlled by a clock CLK (corresponding to the external clock φs) from the PLL circuit 107, is converted into a digital signal, and is demodulated by the digital baseband signal processing circuit 106.

In the circuitry of the radio receiver 100, the A/D converter 105, the digital baseband signal processing circuit 106, and the PLL circuit 107, for example, can be implemented in one LSI (integrated circuit).

Figure 25:
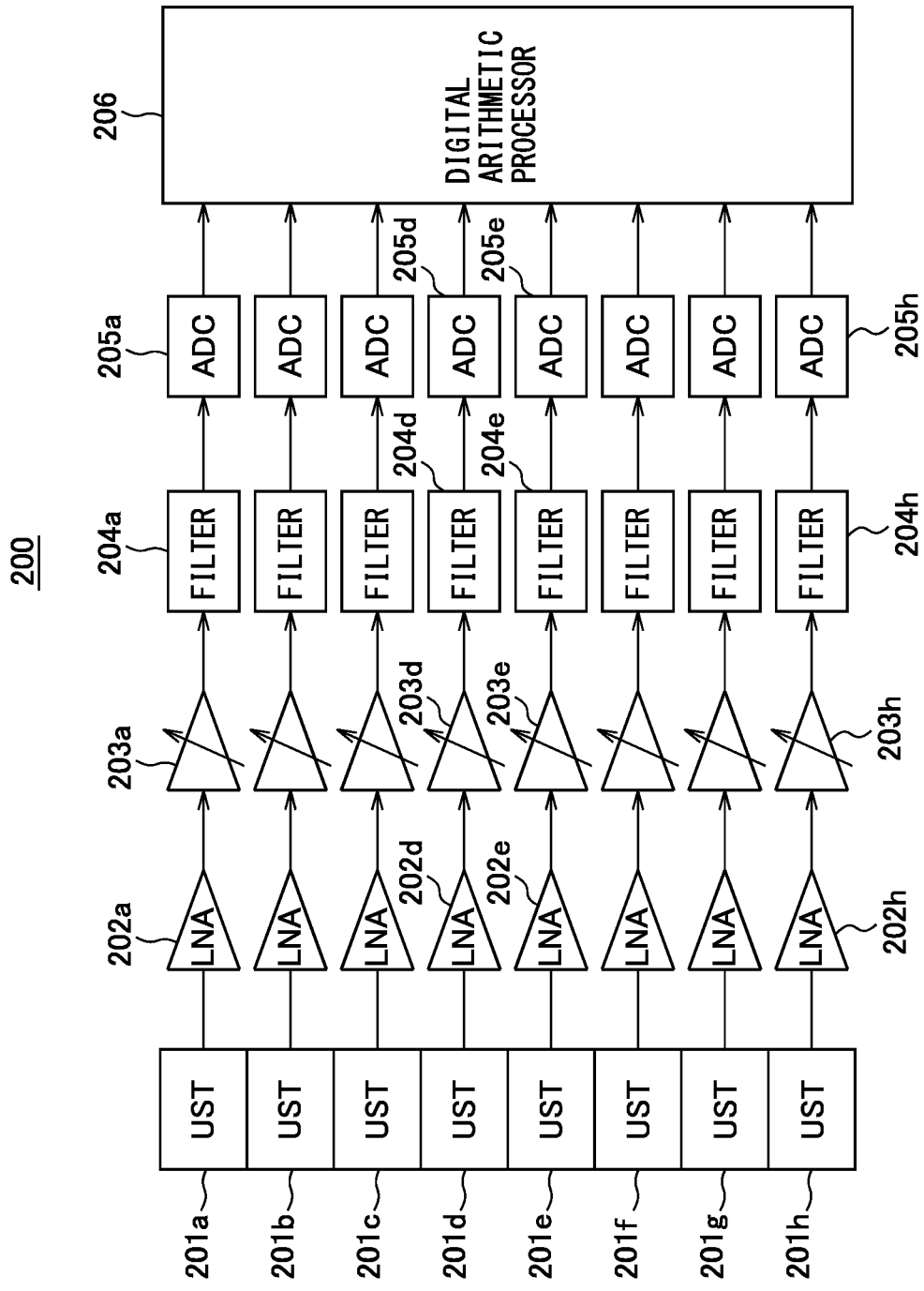
FIG. 25 is a block diagram illustrating an exemplary ultrasonic receiver to which the successive comparison A/D converter according to this embodiment is applied.

FIG. 25 is a block diagram illustrating an exemplary ultrasonic receiver to which the successive comparison A/D converter according to this embodiment is applied, and the successive comparison A/D converter according to this embodiment can be employed as A/D converters (ADCs) 205a to 205h.

An ultrasonic receiver 200 is utilized as an ultrasonic diagnostic device which examines each part of a living body, an ultrasonic nondestructive measuring device which nondestructively measures an object to be measured, a receiving unit for a radar device, or other devices.

The ultrasonic receiver 200 includes ultrasonic transducers (USTs) 201a to 201h, low-noise amplifiers (LNAs) 202a to 202h, and variable gain amplifiers 203a to 203h, as depicted in FIG. 25.

The ultrasonic receiver 200 also includes filters 204a to 204h, the A/D converters (ADCs) 205a to 205h, and a digital arithmetic processor 206. Although eight ultrasonic transducers 201a to 201h, for example, are used in FIG. 25, various types of ultrasonic transducers may be used depending on their application purpose, as a matter of course.

The ultrasonic receiver 200, for example, amplifies signals from the ultrasonic transducers 201a to 201h by the low-noise amplifiers 202a to 202h, and adjusts their gains by the variable gain amplifiers 203a to 203h.

Predetermined frequency components are extracted by the filters 204a to 204h, and the resultant signals are converted into digital signals by the A/D converters 205a to 205h and processed by the digital arithmetic processor 206 to, for example, examine each part of a living body or measure an object to be measured.

In the circuitry of the ultrasonic receiver 200, the A/D converters 205a to 205h and the digital arithmetic processor 206, for example, can be implemented in one LSI (integrated circuit).

In this manner, the above-mentioned successive comparison A/D converter according to each embodiment is applied to, for example, A/D converters for a radio receiver and an ultrasonic receiver. The successive comparison A/D converter according to each embodiment is not limited in its application to a radio receiver and an ultrasonic receiver and is applicable to various integrated circuits.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations can be made hereto without departing from the spirit and scope of the invention.

What is claimed is:

1. A clock generation circuit comprising:
a first loop circuit configured to generate a first clock; and
a second loop circuit configured to generate a second clock including a period different from a period of the first clock, wherein
a fluctuation in an amount of delay of the first clock is adjusted based on the second clock and the first clock including the period adjusted is output.

2. The clock generation circuit as claimed in claim 1, wherein
the first loop circuit includes:
a first delay amount variable circuit configured to control the amount of delay of the first clock; and
a delay adjustment amount calculation circuit configured to receive the first clock and the second clock, and output a delay amount adjustment code for controlling the first delay amount variable circuit, and
the second loop circuit includes:
a first fixed delay circuit configured to apply a fixed amount of delay to the second clock; and
a second delay amount variable circuit configured to control an amount of delay of the second clock, based on the delay amount adjustment code.

3. The clock generation circuit as claimed in claim 2, wherein
the first fixed delay circuit is controlled in an amount of delay by a fixed delay code fixed during an operation of the clock generation circuit, and
the fixed delay code is set larger than one code of the delay amount adjustment code.

4. The clock generation circuit as claimed in claim 2, wherein
when the amount of delay of the first clock is decreased, the delay adjustment amount calculation circuit is configured to output the delay amount adjustment code to increase the amount of delay of the first clock, based on the second clock.

5. The clock generation circuit as claimed in claim 4, wherein
the delay adjustment amount calculation circuit is configured to count edges of the first clock, and
when an edge count value in a first period is larger than a first count value, the delay adjustment amount calculation circuit is configured to determine that the amount of delay of the first clock is decreased.

6. The clock generation circuit as claimed in claim 1, wherein
the first loop circuit includes:
a second fixed delay circuit configured to apply a fixed amount of delay to the first clock;
a first delay amount variable circuit configured to control the amount of delay of the first clock; and
a delay adjustment amount calculation circuit configured to receive the first clock and the second clock, and output a delay amount adjustment code for controlling the first delay amount variable circuit, and
the second loop circuit includes:
a second delay amount variable circuit configured to control an amount of delay of the second clock, based on the delay amount adjustment code.

7. The clock generation circuit as claimed in claim 6, wherein
the second fixed delay circuit is controlled in an amount of delay by a fixed delay code fixed during a circuit operation, and
the fixed delay code is set larger than one code of the delay amount adjustment code.

8. The clock generation circuit as claimed in claim 6, wherein
when the amount of delay of the first clock is increased, the delay adjustment amount calculation circuit is configured to output the delay amount adjustment code to decrease the amount of delay of the first clock, based on the second clock.

9. The clock generation circuit as claimed in claim 8, wherein
the delay adjustment amount calculation circuit is configured to count edges of the first clock, and
when an edge count value in a first period is smaller than a first count value, the delay adjustment amount calculation circuit is configured to determine that the amount of delay of the first clock is increased.

10. The clock generation circuit as claimed in claim 1, wherein
the first loop circuit includes:
a third fixed delay circuit configured to apply a fixed amount of delay to the first clock;
a first delay amount variable circuit configured to control the amount of delay of the first clock; and
a delay adjustment amount calculation circuit configured to receive the first clock and the second clock, and output a delay amount adjustment code for controlling the first delay amount variable circuit,
the second clock includes a first sub-clock and a second sub-clock,
the second loop circuit includes:
a first sub-loop circuit configured to generate the first sub-clock; and
a second sub-loop circuit configured to generate the second sub-clock,
the first sub-loop circuit includes:
a fourth fixed delay circuit configured to apply a fixed amount of delay to the first sub-clock; and
a first sub-delay amount variable circuit configured to control an amount of delay of the first sub-clock, based on the delay amount adjustment code, and
the second sub-loop circuit includes a second sub-delay amount variable circuit configured to control an amount of delay of the second sub-clock, based on the delay amount adjustment code.

11. The clock generation circuit as claimed in claim 10, wherein
the fourth fixed delay circuit and the third fixed delay circuit are controlled in amount of delay by a fixed delay code fixed during an operation of the clock generation circuit, so that the amount of delay of the fourth fixed delay circuit becomes twice the amount of delay of the third fixed delay circuit, and
the fixed delay code is set larger than one code of the delay amount adjustment code.

12. The clock generation circuit as claimed in claim 10, wherein
when the amount of delay of the first clock is decreased, the delay adjustment amount calculation circuit is configured to output the delay amount adjustment code to increase an amount of delay of the first clock, based on the first sub-clock, and
when the amount of delay of the first clock is increased, the delay adjustment amount calculation circuit is configured to output the delay amount adjustment code to decrease the amount of delay of the first clock, based on the second sub-clock.

13. The clock generation circuit as claimed in claim 12, wherein
the delay adjustment amount calculation circuit is configured to count edges of the first clock,
when an edge count value in a first period is larger than a first count value, the delay adjustment amount calculation circuit is configured to determine that the amount of delay of the first clock is decreased, and when the edge count value in the first period is become smaller than the first count value, the delay adjustment amount calculation circuit is configured to determine that the amount of delay of the first clock is increased.

14. A successive comparison A/D converter comprising:
a DAC configured to generate an analog voltage based on a digital code;
a comparator configured to perform a comparison operation using, as an input, the analog voltage generated by the DAC;
a DAC control circuit configured to successively change the digital code, based on an output of the comparator, and output a digital output obtained by digitally converting the analog voltage; and
a clock generation circuit configured to generate a first clock for controlling the comparison operation of the comparator, wherein
the clock generation circuit includes:
a first loop circuit configured to generate the first clock; and
a second loop circuit configured to generate a second clock including a period different from a period of the first clock, wherein
a fluctuation in an amount of delay of the first clock is adjusted based on the second clock and the first clock including the period adjusted is output.

15. The successive comparison A/D converter as claimed in claim 14, wherein
the delay adjustment amount calculation circuit is configured to control adjustment of the amount of delay of the first clock, so that a count of operations for controlling the comparison operation of the comparator by the first clock becomes equal to a resolution of the successive comparison A/D converter in a successive comparison period.

16. An integrated circuit comprising:
an A/D converter configured to output a digital output; and
a processing circuit configured to perform processing based on the digital output, wherein
the A/D converter includes a successive comparison A/D converter including:
a DAC configured to generate an analog voltage based on a digital code;
a comparator configured to perform a comparison operation using, as an input, the analog voltage generated by the DAC;
a DAC control circuit configured to successively change the digital code, based on the output of the comparator, and output a digital output obtained by digitally converting the analog voltage; and
a clock generation circuit configured to generate a first clock for controlling the comparison operation of the comparator, wherein
the clock generation circuit includes:
a first loop circuit configured to generate a first clock; and
a second loop circuit configured to generate a second clock including a period different from a period of the first clock, and wherein
a fluctuation in an amount of delay of the first clock is adjusted based on the second clock and the first clock including the period adjusted is output.

17. A method for adjusting an operation clock of a successive comparison A/D converter including:
a DAC configured to generate an analog voltage based on a digital code;
a comparator configured to perform a comparison operation using, as an input, the analog voltage generated by the DAC;
a DAC control circuit configured to successively change the digital code, based on an output of the comparator, and output a digital output obtained by digitally converting the analog voltage; and
a clock generation circuit configured to generate a first clock for controlling the comparison operation of the comparator,
the method comprising:
providing a second clock including a period longer than a period of the first clock;
controlling amounts of delay of the first clock and the second clock, based on a delay amount adjustment code;
applying an amount of delay fixed during an operation of the successive comparison A/D converter to the second clock by a fixed delay code set larger than one code of the delay amount adjustment code; and
adjusting the delay amount adjustment code to increase the amount of delay of the first clock, based on the second clock, when the amount of delay of the first clock is decreased.

18. A method for adjusting an operation clock of a successive comparison A/D converter including:
a DAC configured to generate an analog voltage based on a digital code;
a comparator configured to perform a comparison operation using, as an input, the analog voltage generated by the DAC;
a DAC control circuit configured to successively change the digital code, based on an output of the comparator, and output a digital output obtained by digitally converting the analog voltage; and
a clock generation circuit configured to generate a first clock for controlling the comparison operation of the comparator,
the method comprising:
providing a second clock including a period shorter than a period of the first clock;
controlling amounts of delay of the first clock and the second clock, based on a delay amount adjustment code;
applying an amount of delay fixed during an operation of the successive comparison A/D converter to the first clock by a fixed delay code set larger than one code of the delay amount adjustment code; and
adjusting the delay amount adjustment code to decrease the amount of delay of the first clock, based on the second clock, when the amount of delay of the first clock is increased.

19. A method for adjusting an operation clock of a successive comparison A/D converter including:
a DAC configured to generate an analog voltage based on a digital code;
a comparator configured to perform a comparison operation using, as an input, the analog voltage generated by the DAC;
a DAC control circuit configured to successively change the digital code, based on an output of the comparator, and output a digital output obtained by digitally converting the analog voltage; and
a clock generation circuit configured to generate a first clock for controlling the comparison operation of the comparator, the method comprising:
- providing a first sub-clock including a period longer than a period of the first clock, and a second sub-clock including a period shorter than the period of the first clock;
- controlling amounts of delay of the first clock, the first sub-clock, and the second sub-clock, based on a delay amount adjustment code;
- applying a first amount of delay fixed during a circuit operation to the first clock by a fixed delay code set larger than one code of the delay amount adjustment code;
- applying a second amount of delay that is fixed during an operation of the successive comparison A/D converter and twice the first amount of delay to the first sub-clock by a fixed delay code set larger than the one code of the delay amount adjustment code;
- adjusting the delay amount adjustment code to increase the amount of delay of the first clock, based on the first sub-clock, when the amount of delay of the first clock is decreased; and
- adjusting the delay amount adjustment code to decrease the amount of delay of the first clock, based on the second sub-clock, when the amount of delay of the first clock is increased.

* * * * *